(12) United States Patent
Hush

(10) Patent No.: US 9,711,207 B2
(45) Date of Patent: Jul. 18, 2017

(54) PERFORMING LOGICAL OPERATIONS USING SENSING CIRCUITRY

(71) Applicant: Micron Technology, Inc., Boise, ID (US)

(72) Inventor: Glen E. Hush, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/717,580

(22) Filed: May 20, 2015

(65) Prior Publication Data

US 2015/0357022 A1    Dec. 10, 2015

Related U.S. Application Data

(60) Provisional application No. 62/008,133, filed on Jun. 5, 2014.

(51) Int. Cl.
| | |
|---|---|
| G11C 7/00 | (2006.01) |
| G11C 11/4091 | (2006.01) |
| G11C 11/4074 | (2006.01) |
| G11C 7/06 | (2006.01) |
| G11C 7/10 | (2006.01) |
| G11C 11/4093 | (2006.01) |

(52) U.S. Cl.
CPC .......... *G11C 11/4091* (2013.01); *G11C 7/065* (2013.01); *G11C 7/1006* (2013.01); *G11C 7/1012* (2013.01); *G11C 11/4074* (2013.01); *G11C 11/4093* (2013.01)

(58) Field of Classification Search
CPC ................. G11C 7/062–7/065; G11C 7/08
USPC ........................................ 365/202, 196, 205
See application file for complete search history.

(56) References Cited

U.S. PATENT DOCUMENTS

| | | | |
|---|---|---|---|
| 4,380,046 | A | 4/1983 | Fung |
| 4,435,792 | A | 3/1984 | Bechtolsheim |
| 4,435,793 | A | 3/1984 | Ochii |
| 4,727,474 | A | 2/1988 | Batcher |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

International Search Report and Written Opinion from related international application No. PCT/US2015/033516, dated Aug. 25, 2015, 15 pp.

(Continued)

*Primary Examiner* — Han Yang
(74) *Attorney, Agent, or Firm* — Brooks, Cameron & Huebsch, PLLC

(57) ABSTRACT

The present disclosure includes apparatuses and methods related to performing logical operations using sensing circuitry. An example apparatus comprises an array of memory cells and sensing circuitry coupled to the array an array of memory cells via a sense line. The sensing circuitry is configured to sense, as a voltage associated with a second operand of a logical function, a voltage on the sense line corresponding to a first logical data value resulting in part from reading a first memory cell of the array of memory cells associated with a first operand of the logical function.

47 Claims, 18 Drawing Sheets

(56) References Cited

U.S. PATENT DOCUMENTS

| | | |
|---|---|---|
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,189,402 B2 | 5/2012 | Lin |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |

(56) References Cited

U.S. PATENT DOCUMENTS

| | | |
|---|---|---|
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0076054 A1* | 4/2004 | Takahashi ............ G11C 11/406 365/200 |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Colas et al. |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0146627 A1* | 5/2014 | Cho ................... G11C 7/12 365/202 |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0131368 A1* | 5/2015 | Adams ................ G11C 11/419 365/156 |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 0165359 | 9/2001 |
| WO | 2010079451 | 7/2010 |
| WO | 2013062596 A1 | 5/2013 |
| WO | 2013081588 | 6/2013 |
| WO | 2013095592 | 6/2013 |

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.

Kogge, et al, "Processing in Memory: Chips to Petaflops," May 23, 1997, (8 pgs.), retrieved from: http://www.cs.ucf.edu/courses/cda5106/summer02/papers/kogge97PIM.pdf.

Draper, et al, "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

(56) References Cited

OTHER PUBLICATIONS

U.S. Appl. No. 13/796,189, entitled, "Performing Complex Arithmetic Functions in a Memory Device," filed Mar. 12, 2013, (23 pgs.).
Office Action for related Taiwan Patent Application No. 104118419, dated Jun. 20, 2016, 16 pages.
Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, mailed Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Office Action for related Taiwan Patent Application No. 104118419, dated Oct. 24, 2016, 10 pages.

* cited by examiner

PERFORMING LOGICAL OPERATIONS USING SENSING CIRCUITRY

PRIORITY INFORMATION

This application is a Non-Provisional of U.S. Provisional Application No. 62/008,133, filed Jun. 5, 2014, the contents of which are incorporated herein by reference.

TECHNICAL FIELD

The present disclosure relates generally to semiconductor memory and methods, and more particularly, to apparatuses and methods related to performing logical operations using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry (FUC) may be used to perform arithmetic operations such as addition, subtraction, multiplication, and/or division on operands via a number of logical operations.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

In many instances, the processing resources (e.g., processor and/or associated FUC) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may conserve time and power in processing. However, such PIM devices may have various drawbacks such as an increased chip size. Moreover, such PIM devices may still consume undesirable amounts of power in association with performing logical operations (e.g., compute functions).

DETAILED DESCRIPTION

Figure 1:
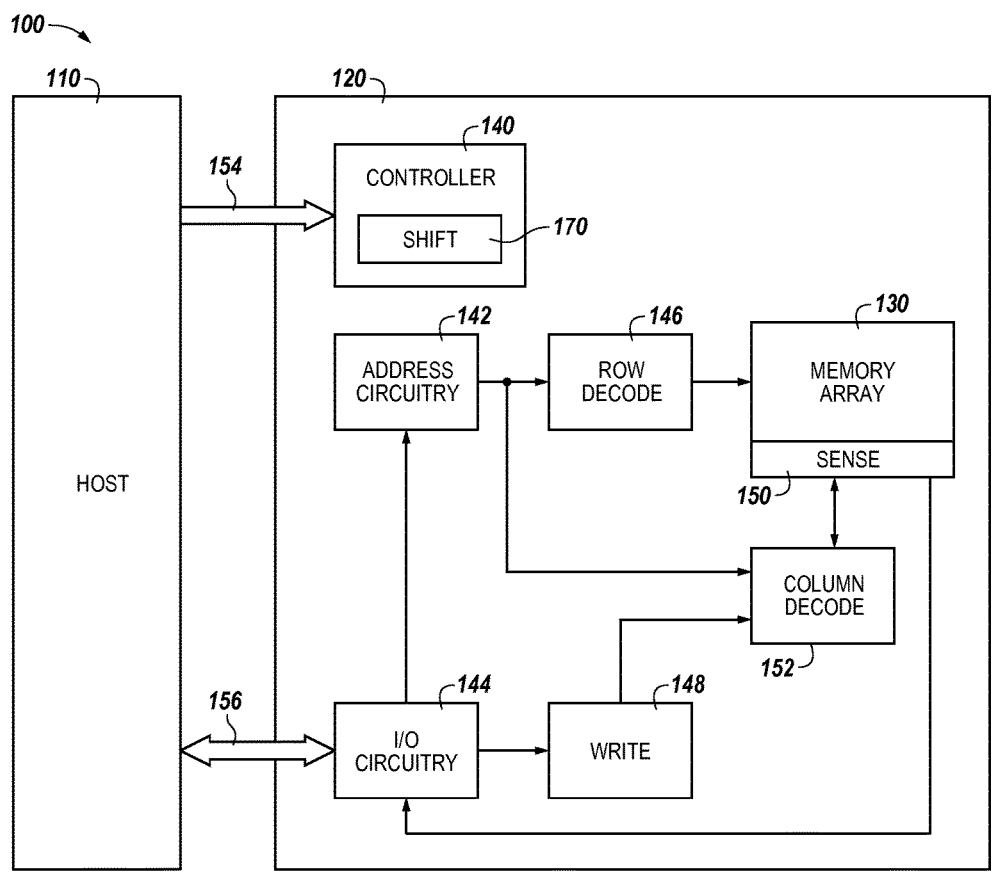
FIG. 1 is a block diagram of an apparatus in the form of a computing system including a memory device in accordance with a number of embodiments of the present disclosure.

The present disclosure includes apparatuses and methods related to performing logical operations using sensing circuitry. An example apparatus comprises an array of memory cells and sensing circuitry coupled to the array an array of memory cells via a sense line. The sensing circuitry is configured to sense, as a voltage associated with a second operand of a logical function, a voltage on the sense line corresponding to a first logical data value resulting in part from reading a first memory cell of the array of memory cells associated with a first operand of the logical function.

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with memory cells of the array and capable of performing compute functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of banks of DRAM cells). An example DRAM array is described in association with FIG. 2.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

The controller 140 can include a shift controller 170 that can control signals provided to, for instance, shift circuitry in association with performing data shifting as described further herein. For example, the shift controller 170 can control shifting data (e.g., right or left) in an array.

Examples of the sensing circuitry 150 are described further below. For instance, in a number of embodiments, the sensing circuitry 150 can comprise a number of sense amplifiers (e.g., sense amplifier 206 shown in FIG. 2 or sense amplifier 706 shown in FIG. 7) and a number of compute components (e.g., compute component 231-1 shown in FIG. 2), which may serve as, and be referred to herein as, an accumulator and can be used to perform logical operations (e.g., on data associated with complementary data lines).

In a number of embodiments, the sensing circuitry (e.g., 150) can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on control circuitry 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry (e.g., 150) is configured to perform logical operations on data stored in memory (e.g., array 130) and store the result back to the memory without enabling an I/O line (e.g., a local I/O line) coupled to the sensing circuitry, which can be formed on pitch with the memory cells of the array. Enabling an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to perform logical operations without enabling column decode lines of the array; however, the local I/O line(s) may be enabled in order to transfer a result to a suitable location other than back to the array (e.g., to an external register).

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2:
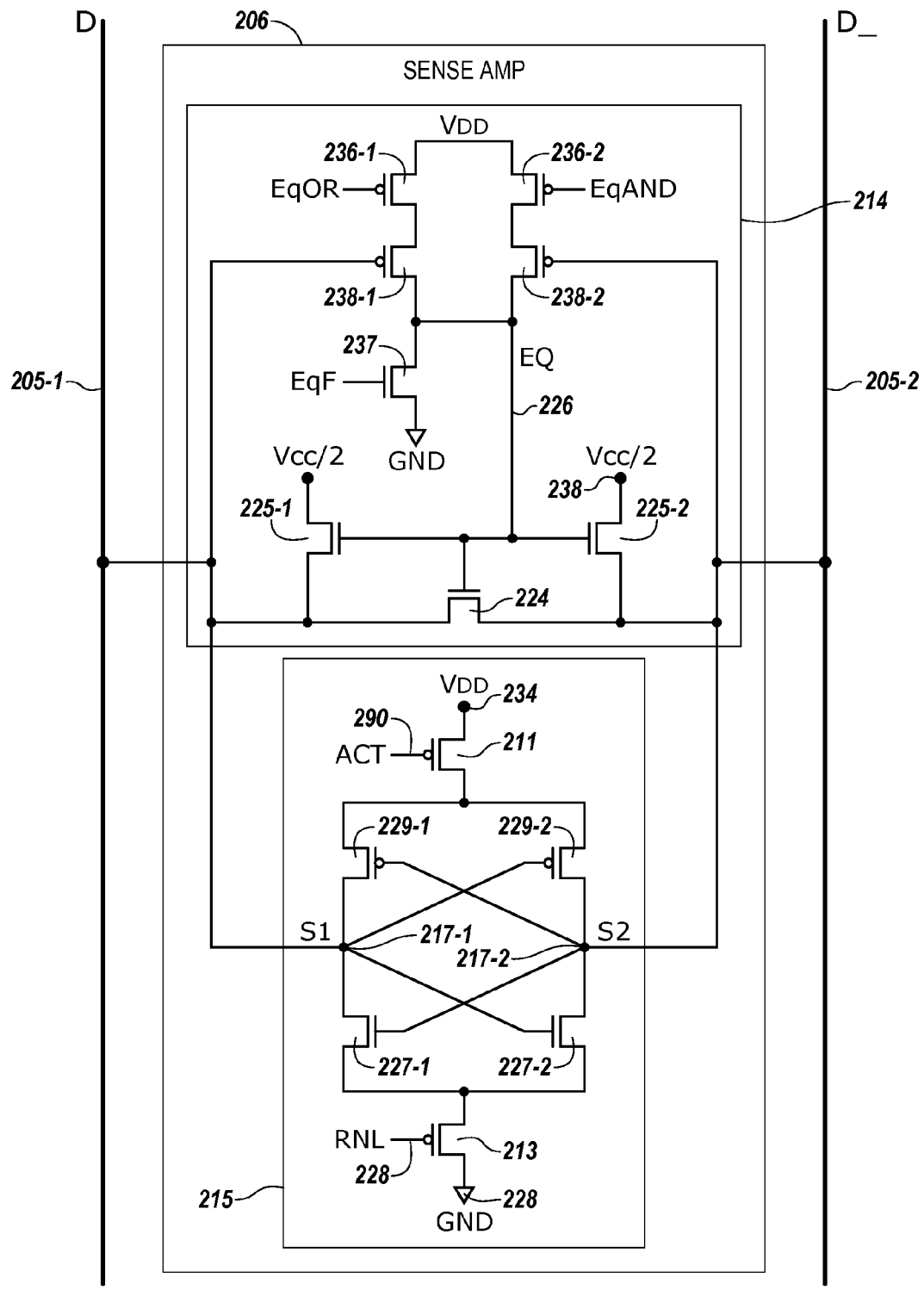
FIG. 2 is a schematic diagram illustrating a portion of sensing circuitry in accordance with a number of embodiments of the present disclosure.

FIG. 2 is a schematic diagram illustrating a portion of sensing circuitry in accordance with a number of embodiments of the present disclosure. In this example, the portion of sensing circuitry comprises a sense amplifier 206. In a number of embodiments, one sense amplifier 206 (e.g., "sense amplifier") is provided for each column of memory cells in an array (e.g., array 130). The sense amplifier 206 can be sense amplifier of a DRAM array, for instance. In this example, sense amplifier 206 is coupled to a pair of complementary data lines 205-1 (D) and 205-2 (D_). As such, the sense amplifier 206 can be coupled to all of the memory cells in a respective column through data lines 205-1 (D) and 205-2 (D_).

The sense amplifier 206 can include equilibration circuitry 214 and a latch 215 (e.g., a static latch such as a cross coupled latch). The latch 215 can include a pair of cross coupled n-channel transistors (e.g., NMOS transistors) 227-1 and 227-2 having their respective sources selectively coupled to a reference voltage (e.g., ground) through a sink transistor 213. A gate of the sink transistor 213 can be coupled to a control signal line 228 providing a control signal (e.g., RNL). The sink transistor 213 can be a p-channel transistor, which is enabled to conduct by the control signal on control signal line 228 going low. The cross coupled n-channel transistor 227-1 can have a drain directly coupled to a first latch node 217-1 (S1), and cross coupled n-channel transistor 227-2 can have a drain directly coupled to a second latch node 217-2 (S2). The first latch node 217-1 (S1) is coupled to data line 205-1 (D), and the second latch node 217-2 (S2) is coupled to data line 205-2 (D_).

The latch 215 can also include a pair of cross coupled p-channel transistors (e.g., PMOS transistors) 229-1 and 229-2 having their respective sources selectively coupled to a supply voltage (e.g., $V_{CC}$) through a source transistor 211. A gate of the source transistor 211 can be coupled to a control signal line 290 providing a control signal (e.g., ACT). As shown in FIG. 2, the source transistor 211 can be a p-channel transistor, which is enabled to conduct by the control signal on control signal line 290 going low. Cross coupled p-channel transistor 229-1 can have a drain directly coupled to the first latch node 217-1 (S1), and cross coupled p-channel transistor 229-2 can have a drain directly coupled to the second latch node 217-2 (S2).

A gate of cross coupled n-channel transistor 227-1 and a gate of cross coupled p-channel transistor 229-1 are coupled to the second latch node 217-2 (S2). A gate of cross coupled n-channel transistor 227-2 and a gate of cross coupled p-channel transistor 229-2 are coupled to the second latch node 217-1 (S1).

Equilibration circuitry 214 can be configured to equilibrate the data lines 205-1 (D) and 205-2 (D_). In this example, the equilibration circuitry 214 comprises a transistor 224 coupled between data lines 205-1 (D) and 205-2 (D_). The equilibration circuitry 214 also comprises transistors 225-1 and 225-2 each having a first source/drain region coupled to an equilibration voltage (e.g., $V_{CC}/2$), where $V_{CC}$ is a supply voltage associated with the array. A second source/drain region of transistor 225-1 can be coupled data line 205-1 (D), and a second source/drain region of transistor 225-2 can be coupled data line 205-2 (D_). Gates of transistors 224, 225-1, and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage (e.g., $V_{CC}/2$).

Equilibration circuitry 214 can further comprise transistors 237, 238-1, 238-2, 236-1, and 236-2 configured as shown in FIG. 2. A first source/drain region of transistor 236-1 is coupled to a first source/drain region of transistor 238-1. A first source/drain region of transistor 236-2 is coupled to a first source/drain region of transistor 238-2. A second source/drain region of transistor 236-1 and a second source/drain region of transistor 236-2 are coupled to the supply voltage associated with the array of memory cells (e.g., $V_{CC}$). A second source/drain region of transistor 238-1 and a second source/drain region of transistor 238-2 are coupled to the equilibration (EQ) control signal line 226 (and/or to the gates of transistors 224, 225-1, and 225-2). A gate of transistor 238-1 is coupled to data line 205-1 (D), and a gate of transistor 238-1 is coupled to data line 205-2 (D_).

A gate of transistor 236-1 is coupled to an OR logical function control signal line (e.g., EqOR), and a gate of transistor 236-2 is coupled to an AND logical function control signal line (e.g., EqAND). Transistor 237 is coupled between the equilibration (EQ) control signal line 226 and a reference voltage line (e.g., ground). A gate of transistor 237 is coupled to an EQ logic control signal line (e.g., EqF).

According to various embodiments, transistors 224, 225-1, 225-2, and 237 are n-channel transistors and transistors 236-1, 236-2, 238-1, and 238-2 are p-channel transistors, as shown in FIG. 2. However, embodiments of the present invention are not limited to the transistors of the particular conductivity type provided in this example configuration. For example, opposite control signals can be used with transistors of opposite conductivity type to implement same sense amplifier functionality.

The sense amplifier 206 can also include additional transistors used to interface with the memory array in conventional ways, such as transistors having gates coupled to a column decode signal or a column select signal. And the data lines 205-1 (D) and 205-2 (D_) can be coupled to respective local I/O lines (e.g., IO and IO_) that are responsive to an enabling signal to perform an operation such as a data line access in association with a read operation. Such an enabling signal can be activated to transfer a signal corresponding to the state (e.g., a logic data value such as logic "0" or logic "1") of the memory cell being accessed out of the array on the I/O lines.

In operation, when a memory cell is being sensed (e.g., read), the voltage on one of the data lines 205-1 (D) or 205-2 (D_) will be slightly greater than the voltage on the other one of data lines 205-1 (D) or 205-2 (D_). The ACT signal 290 and the RNL signal 228 are then driven low to enable the sense amplifier 206. The data lines 205-1 (D) or 205-2 (D_) having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage $V_{CC}$ through source transistor 211, and the other data line 205-1 (D) or 205-2 (D_) is driven to the voltage of the reference voltage (e.g., ground) through the sink transistor 213. Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell. As used herein, the cross coupled latch of sense amplifier 206 may be referred to as a primary latch 215. In contrast, and as described above in connection with FIGS. 8 and 13, a cross coupled latch associated with a compute circuit (e.g., compute circuit 831-1 shown in FIG. 8, 1331-1 shown in FIG. 13) may be referred to as a secondary latch. Transistors of the primary latch 215 and the secondary latch (e.g., 864 shown in FIG. 8) can be formed on pitch with memory cells of the array, for instance.

Figure 3:
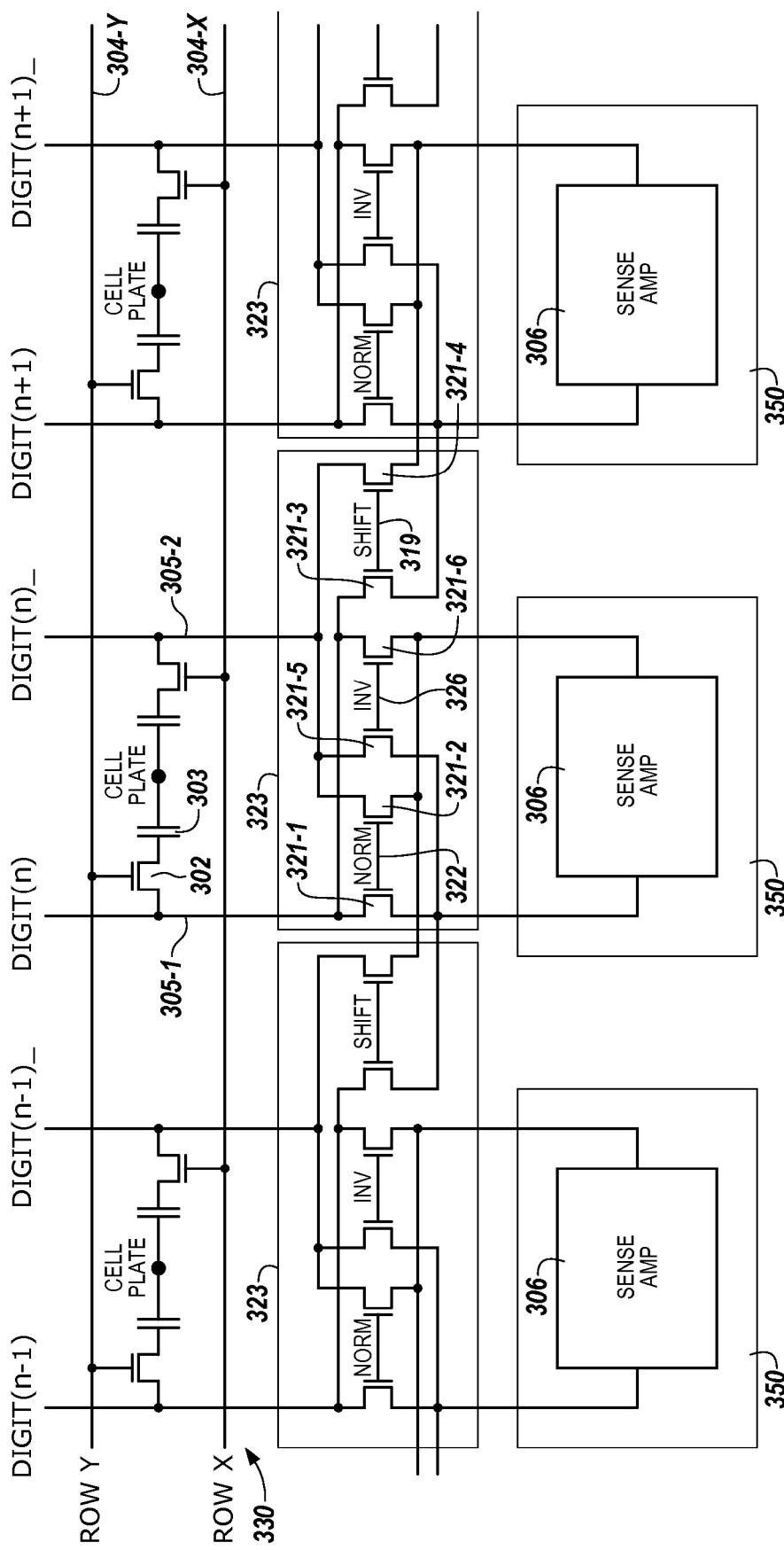
FIG. 3 is a schematic diagram illustrating sensing circuitry in accordance with a number of embodiments of the present disclosure.

FIG. 3 is a schematic diagram illustrating sensing circuitry in accordance with a number of embodiments of the present disclosure. In this example, the memory array 330 is a DRAM array of 1T1C (one transistor one capacitor) memory cells each comprised of an access device 302 (e.g., transistor) and a storage element 303 (e.g., a capacitor). In a number of embodiments, the memory cells may be destructive read memory cells (e.g., reading the data stored in the cell destroys the data such that the data originally stored in the cell is refreshed after being read). The cells of the memory array 330 are arranged in rows coupled by word lines 304-X (Row X), 304-Y (Row Y), etc. and columns coupled by pairs of complementary data lines DIGIT(n−1)/ DIGIT(n−1)_, DIGIT(n)/DIGIT(n)_, DIGIT(n+1)/DIGIT (n+1)_. The individual data lines corresponding to each pair of complementary data lines can also be referred to as data lines 305-1 (D) and 305-2 (D_) respectively. Although only three pair of complementary data lines are shown in FIG. 3, embodiments of the present disclosure are not so limited, and an array of memory cells can include additional columns of memory cells and/or data lines (e.g., 4,096, 8,192, 16,384, etc.).

As shown in FIG. 3, a gate of a particular memory cell transistor 302 can be coupled to its corresponding word line 304-X, 304-Y, etc., a first source/drain region can be coupled to its corresponding data line (e.g., 305-1 (D), 305-2 (D_)), and a second source/drain region of a particular memory cell transistor can be coupled to its corresponding capacitor 303.

Figure 6:
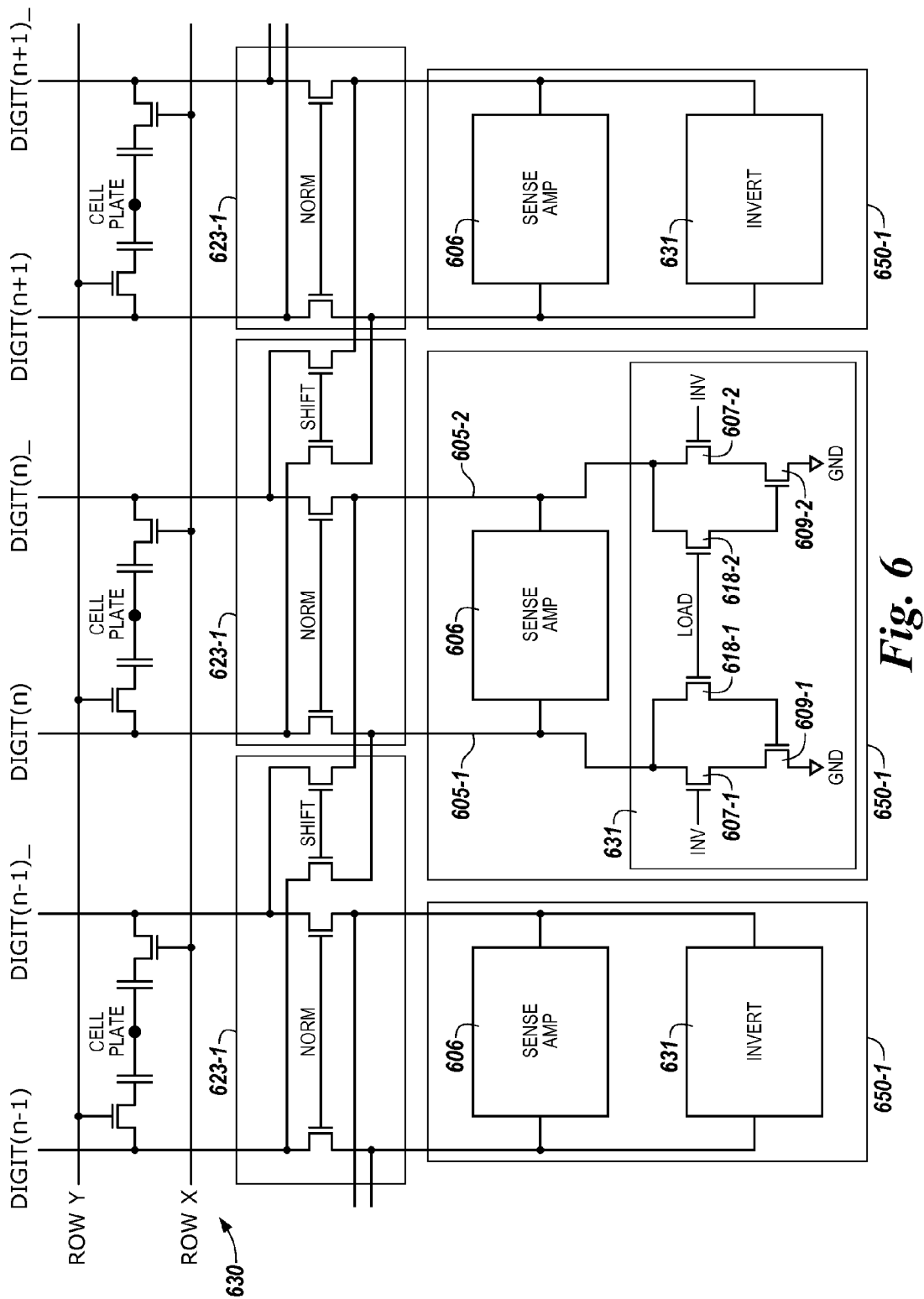
FIG. 6 is a schematic diagram illustrating sensing circuitry in accordance with a number of embodiments of the present disclosure.

The memory array 330 is coupled to sensing circuitry 350 in accordance with a number of embodiments of the present disclosure. In this example, the sensing circuitry 350 comprises a sense amplifier 306 corresponding to respective columns of memory cells (e.g., coupled to respective pairs of complementary data lines 305-1 (D), 305-2 (D_)) but does not additionally comprise a compute component (e.g., 631 shown in FIG. 6, 831-2 shown in FIG. 8 that can perform invert and/or accumulator functionality). The sensing circuitry can correspond to sensing circuitry 150 shown in FIG. 1, for example.

The sense amplifier 306 can correspond to sense amplifier 206 described previously with respect to FIG. 2. The sense amplifier 306 can be operated to determine a data value (e.g., logic state) stored in a selected memory cell and/or represented by the voltages present on the complementary data lines 305-1 (D), 305-2 (D_). As previously discussed, a sense amplifier (e.g., 306) can include a cross coupled latch, which can be referred to herein as a primary latch. Embodiments of sense amplifier 306 are not limited to the example sense amplifier 206 shown in FIG. 2, and can be, for example, a current-mode sense amplifier and/or single-ended sense amplifier (e.g., sense amplifier coupled to one data line). Also, embodiments of the present disclosure are not limited to a folded data line architecture. In a number of embodiments, the sense amplifier 306 can be operated to perform a logical operation using the equilibration circuitry, and/or in conjunction with invert circuitry, with the result being stored in the primary latch without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logic functions are used in many higher level functions. Consequently, speed and/or power efficiencies that can be realized with improved logical operations, which can translate into speed and/or power efficiencies of higher order functionalities. Described herein are apparatuses and methods for performing logical operations without transferring data via an input/output (I/O) line and/or without transferring data to a control component external to the array. Depending on memory array architecture, the apparatuses and methods for performing the logical operations may not require amplification of a sense line (e.g., data line, digit line, bit line) pair.

As shown in FIG. 3, sensing circuitry 350 can be coupled to the memory array 330 via shift circuitry 323. In this example, the shift circuitry 323 comprises a pair of isolation transistors 321-1 and 321-2 coupled intermediate within the data lines 305-1 (D) and 305-2 (D_). That is, a first source/drain region of isolation transistor 321-1 can be coupled to a first portion of data line 305-1 (D) and a second source/drain region of isolation transistor 321-1 can be coupled to a second portion of data line 305-1 (D). Isolation transistor 321-2 can be similarly coupled between portions of data line 305-2 (D_).

Gates of the isolation transistors 321-1 and 321-2 are coupled to a control signal 322 (e.g., "NORM") that, when activated, enables (e.g., turns on) the isolation transistors 321-1 and 321-2 to couple the corresponding sense amplifier 306 to a column of memory cells coupled to the pair of complementary data lines 305-1 (D) and 305-2 (D_). According to various embodiments, isolation transistors 321-1 and 321-2 coupling memory cells to a particular sense amplifier 306 can be referred to as a "normal" configuration of the shift circuitry 323.

In the example illustrated in FIG. 3, the shift circuitry 323 also includes another (e.g., a second) pair of isolation transistors 321-3 and 321-4 coupled between a sense amplifier 306 and an adjacent pair of complementary data lines 305-1 (D) and 305-2 (D_). As shown in FIG. 3, isolation transistors 321-3 and 321-4 are configured to couple the pair of complementary data lines 305-1 (D) and 305-2 (D_) (e.g., DIGIT(n)/DIGIT(n)_ to an adjacent sense amplifier 306. Isolation transistors 321-3 and 321-4 may also be described as being configured to couple a sense amplifier 306 (e.g., corresponding to the pair of complementary data lines 305-1 (D) and 305-2 (D_) such as DIGIT(n)/DIGIT(n)_) to an adjacent pair of complementary data lines 305-1 (D) and 305-2 (D_)) (e.g., DIGIT(n−1)/DIGIT(n−1)_).

Isolation transistors 321-3 and 321-4 are configured to couple the adjacent pair of complementary data lines from one side of isolation transistors 321-1 and 321-2 (e.g., a portion of the adjacent pair of complementary data lines 305-1 (D) and 305-2 to which memory cells are coupled) to an opposite side of isolation transistors 321-1 and 321-2 of a different shift circuitry 323 coupled to the pair of complementary data lines 305-1 (D) and 305-2 (e.g., a portion of the pair of complementary data lines 305-1 (D) and 305-2 to which sense amplifier 306 is coupled). The gates of isolation transistors 321-3 and 321-4 can be coupled to a control signal 319 (e.g., "SHIFT"), which can be activated, for example, when the NORM control signal 322 is deactivated.

Although shift circuitry 323 shown in FIG. 3 is configured such that isolation transistors 321-3 and 321-4 couple a pair of complementary data lines 305-1 (D) and 305-2 (D_) to a right-adjacent sense amplifier 306 (e.g., or coupled a sense amplifier to a left-adjacent pair of complementary data lines 305-1 (D) and 305-2 (D_)), embodiments of the present disclosure are not limited to the particular configuration illustrated in FIG. 3. For instance, isolation transistors 321-3 and 321-4 can be configured to couple a pair of complementary data lines 305-1 (D) and 305-2 (D_) to a left adjacent sense amplifier 306 (e.g., or coupled a sense amplifier to a right-adjacent pair of complementary data lines 305-1 (D) and 305-2 (D_)). According to some embodiments of the present disclosure, isolation transistors 321-3 and 321-4 can be configured to couple a pair of complementary data lines 305-1 (D) and 305-2 (D_) to a sense amplifier 306 that is non-adjacent (e.g., a different sense amplifier 306 than to which isolation transistors 321-1 and 321-2 couple the pair of complementary data lines 305-1 (D) and 305-2 (D_)).

In the example illustrated in FIG. 3, the shift circuitry 323 further includes another (e.g., a third) pair of isolation transistors 321-5 and 321-6 coupled between a sense amplifier 306 and the corresponding pair of complementary data lines 305-1 (D) and 305-2 (D_) (e.g., the pair of complementary data lines 305-1 (D) and 305-2 (D_) to which isolation transistors 321-1 and 321-2 couple a particular sense amplifier 306. However, isolation transistors 321-5 and 321-6 are configured to couple the pair of complementary data lines 305-1 (D) and 305-2 (D_) to the sense amplifier 306 in an opposite orientation than the orientation in which isolation transistors isolation transistors 321-1 and 321-2 couple the pair of complementary data lines 305-1 (D) and 305-2 (D_) to the sense amplifier 306. Isolation transistors 321-5 and 321-6 transpose the pair of complementary data lines 305-1 (D) and 305-2 (D_) in coupling to the sense amplifier 306.

That is, isolation transistor 321-1 and 321-2 can be configured to couple data line 305-1 (D) to node S1 of the primary latch (e.g., 217-1 shown in FIG. 2) and to couple data line 305-2 (D_) to node S2 of the primary latch (e.g., 217-2 shown in FIG. 2), and isolation transistors 321-5 and 321-6 can be configured to couple data line 305-1 (D) to node S2 of the primary latch (e.g., 217-2 shown in FIG. 2) and to couple data line 305-2 (D_) to node S1 of the primary latch (e.g., 217-1 shown in FIG. 2). As such, isolation transistors 321-5 and 321-6 are configured to invert the pair of complementary data lines 305-1 (D) and 305-2 (D_) to the primary latch (e.g., 215 shown in FIG. 2) of the sense amplifier 306. The gates of isolation transistors 321-5 and 321-6 can be coupled to a control signal 319 (e.g., "INV"), which can be activated, for example, when the NORM control signal 322 is deactivated. Isolation transistors 321-5 and 321-6 can be operated to invert and/or store an inverted data value in the primary latch of the sense amplifier 306.

The shift circuitry 323 is effectively configured as a 3-to-1 multiplexer being able to couple a compute component 350 to one of three possible data line configurations (e.g., normal coupling to a corresponding pair of complementary data lines via a first pair of isolation transistors, shift coupling to an adjacent pair of complementary data lines via a second pair of isolation transistors, and inverted coupling to transposed arrangement of the corresponding pair of complementary data lines via a third pair of isolation transistors).

Embodiments of the present disclosure are not limited to the configuration of shift circuitry 323 shown in FIG. 3. In a number of embodiments, shift circuitry 323 such as that shown in FIG. 3 can be operated (e.g., in conjunction with sense amplifiers 306) in association with performing compute functions such as adding and subtracting functions without transferring data out of the sensing circuitry via an I/O line (e.g., local IO/IO_ lines), for instance.

Each column of memory cells can be coupled to a column decode line that can be enabled to transfer, via local I/O line, a data value from a corresponding sense amplifier 306 to a control component external to the array such as an external processing resource (e.g., host processor and/or other functional unit circuitry). The column decode line can be coupled to a column decoder (e.g., column decoder 152 shown in FIG. 1). However, as described herein, in a number of embodiments, data need not be transferred via such I/O lines to perform logical operations in accordance with embodiments of the present disclosure. In a number of embodiments, shift circuitry 323 such as that shown in FIG. 3 can be operated (e.g., in conjunction with sense amplifiers 306) in performing compute functions such as adding and subtracting functions without transferring data to a control component external to the array, for instance.

Figure 4:
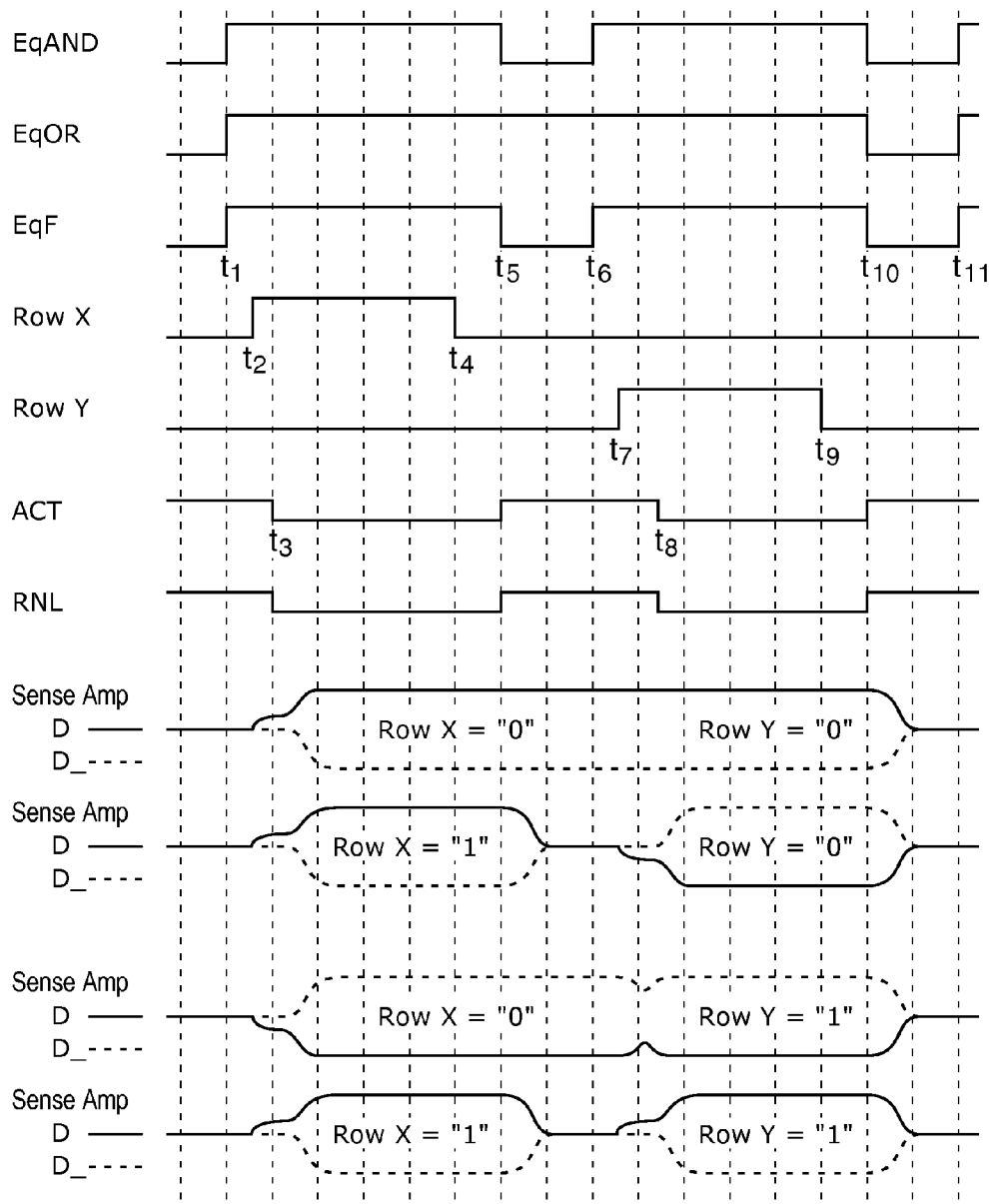
FIG. 4 illustrates a timing diagram associated with performing a number of logical operations using sensing circuitry in accordance with a number of embodiments of the present disclosure.

FIG. 4 illustrates a timing diagram associated with performing a number of logical operations using sensing circuitry in accordance with a number of embodiments of the present disclosure. FIG. 4 illustrates a timing diagram associated with initiating an AND logical operation. FIG. 4 illustrates the sense amplifier signals, including equilibration circuitry signals, for various combinations of first and second operand data values. FIG. 4 shows the respective sense amplifier and equilibration circuitry signals corresponding to each combination of Row X data value and Row Y data value in each set. The particular timing diagram signals are discussed below with respect to the pseudo code associated with an AND operation of the circuit shown in FIG. 3.

An initial operation phase associated with performing a logical operation (e.g., AND operation, OR operation) can involving loading a first operand of the logical operation into the sense amplifier (e.g., sense amplifier 306 shown in FIG. 3 corresponding to sense amplifier 206 shown in detail in FIG. 2). An example of pseudo code associated with loading (e.g., copying) a first data value stored in a cell coupled to row 304-X into the sense amplifier 306 can be summarized as follows:

Copy Row X into the Sense amplifier:
   Disable EQ
   Open Row X
   Fire Sense amplifier (after which Row X data resides in the sense
      amplifier)
   Close Row X
   Activate EqAND
   Precharge (e.g., disable control signals EqF, ACT and RNL)

In the pseudo code above, "Disable EQ" indicates that an equilibration circuitry corresponding to the sense amplifier 306 shown in FIG. 3 (e.g., 214 shown in FIG. 2) is disabled at $t_1$ as shown in FIG. 4. Because transistors 236-1 and 236-1 of the equilibration circuitry 214 shown in FIG. 2 are PMOS transistors, disabling of the equilibration circuitry 214 occurs by equilibration signals EqAND and EqOR going high to turn-off transistors 236-1 and 236-1. Disabling of the equilibration circuitry 214 also involves equilibration signal EqF going high to turn-on transistor 237 to ground the gates of transistors 224, 225-1, and 225-2 (e.g., such that the complementary data lines (e.g., 305-1 (D) and 305-2 (D_) are no longer shorted together and to $V_{CC}/2$).

After the equilibration circuitry 214 is disabled, a selected row (e.g., ROW X) is enabled (e.g., selected, opened such as by activating a signal to select a particular row) as indicated by "Open Row X" in the pseudo code and shown at $t_2$ for signal Row X in FIG. 4. When the voltage signal applied to ROW X 304-X reaches the threshold voltage (Vt) of the access transistor corresponding to the selected cell, the access transistor turns on and couples the data line (e.g., 305-2 (D_) to the selected cell which creates a differential voltage signal between the data lines.

After Row X is opened, in the pseudo code above, "Fire Sense amplifiers" indicates that the sense amplifier 306 is enabled. For example, as shown at $t_3$ in FIG. 3, the ACT positive control signal goes low and the RNL negative control signal goes low, which amplifies the differential signal between 305-1 (D) and D_ 305-2, resulting in a voltage (e.g., $V_{CC}$) corresponding to a logic "1" or a voltage (e.g., GND) corresponding to a logic "0" being on data line 305-1 (D) (and the voltage corresponding to the other logic state being on complementary data line 305-2 (D_)). The sensed data value is stored in the primary latch of sense amplifier 306. The primary energy consumption occurs in charging the data lines (e.g., 305-1 (D) or 305-2 (D_)) from the equilibration voltage $V_{CC}/2$ to the rail voltage $V_{CC}$.

After firing the sense amplifiers, in the pseudo code above, the selected row (e.g., ROW X) is disabled (e.g., deselected, closed such as by deactivating a select signal for a particular row) as indicated by "Close Row X" and indicated at $t_4$ in FIG. 4, which can be accomplished by the access transistor turning off to decouple the selected cell from the corresponding data line. After Row X is closed, in the pseudo code above, "Activate EqAND" indicates that the EqAND control signal is forced low as shown in FIG. 4 at $t_5$, which couples one side of transistor 238-2 to $V_{CC}$ to prepare for "pre-seeding" the sense amplifier 306 with a possible result of the AND logical operation based on the Row X data value.

After the EqAND control signal is forced low (or simultaneous thereto as shown in FIG. 4 at $t_5$), the data lines can be precharged as indicated by the "Precharge" in the pseudo code above. In this case, "Precharge" indicates and attempt to initiate an equilibrate operation to precharge the data lines as shown in FIG. 4 at $t_5$, which pre-seeds" the sense amplifier 306 with a possible result of the AND logical operation based on the Row X data value. An equilibrate operation is initiated by disabling control signals EqF, ACT, and RNL. Control signal EqF is disabled by going low to turn-off transistor 237 shown in FIG. 2, which ungrounds the gates of transistors 224, 225-1, and 225-2. Control signals also turn-off to stop firing the sense amplifier 306.

If Row X contained a logic "0," data line 305-1 (D) is low and data line 305-2 (D_) is high, which causes transistor 238-2 to be off such that $V_{CC}$ is not applied to the gates of transistors 224, 225-1, and 225-2 through transistor 236-2 (which is on because the EqAND control signal is forced low above). As such, the data lines 305-1 and 305-2 do not equilibrate and retain the respective voltages corresponding to the Row X logic "0" data value.

If Row X contained a logic "1," data line 305-1 (D) is high and data line 305-2 (D_) is low, which causes transistor 238-2 to be on such that $V_{CC}$ is applied to the gates of transistors 224, 225-1, and 225-2 through transistor 236-2 (which is on because the EqAND control signal is forced low above). As such, the data lines 305-1 and 305-2 precharge normally (e.g., be shorted together and to Vcc/2), and when a next memory cell is accessed, the data lines 305-1 and 305-2 voltages will modify based on the charge stored in the next-selected memory cell.

A subsequent operation phase associated with performing the AND (or the OR) operation on the first data value (e.g., Row X data value now stored in the sense amplifier 306) and a second data value (stored in a memory cell 302 coupled to Row Y 304-Y) includes performing particular steps which depend on the whether an AND or an OR is to be performed. Example pseudo code associated with "ANDing" the data values can include:

---
Disable EQ
Open Row Y (to pre-seed the sense amplifier with AND data from Row X)
Fire Sense amplifier (Result of AND operation resides in the sense amplifier)
Close Row Y
Precharge

---

In the pseudo code above, "Disable EQ" indicates that an equilibration signal corresponding to the sense amplifier 306 is disabled, which is illustrated in FIG. 4 at $t_6$ (e.g., such that the complementary data lines 305-1 (D) and 305-2 (D_) are no longer shorted to Vcc/2. After equilibration is disabled, a selected row for the second operand of the AND logical operation (e.g., ROW Y) is enabled as indicated in the pseudo code above by "Open Row Y" and shown in FIG. 4 at $t_7$. When the voltage signal applied to ROW Y reaches the threshold voltage (Vt) of the access transistor (e.g., 302) corresponding to the selected cell, the access transistor turns on and couples the data line (e.g., D_ 305-1) to the selected cell (e.g., to capacitor 303) which creates a differential voltage signal between the data lines.

In the initial operation phase of the AND logical operation, the sense amplifier was "pre-seeded" with AND data from the first operand of the AND logical operation (e.g., ROW X), as described above. Upon opening the selected row for the second operand of the AND logical operation (e.g., ROW Y), if Row X contained a logic "0," then data lines 305-1 and 305-2 did not equilibrate thereafter, and maintained voltages associated with a logic "0" data value (at full rails due to the previous firing of the sense amplifier 306), which the charge stored in the selected memory cell will not be sufficient to flip if Row Y contains a logic"1." The result of the AND logical operation will be a logic "0" if Row X contained a logic "0" regardless of the data value stored in the memory cell coupled to Row Y. If Row X contained a logic "1," then data lines 305-1 and 305-2 did equilibrate thereafter and the charge stored in the selected memory cell will modify the voltages on the data lines 305-1 and 305-2 appropriately away from the equilibrate voltage (e.g., $V_{CC}/2$).

After Row Y is opened, in the pseudo code above, "Fire Sense amplifiers" indicates that the sense amplifier 306 is enabled to amplify the differential signal between 305-1 (D) and 305-2 (D_), resulting in a voltage (e.g., $V_{CC}$) corresponding to a logic "1" or a voltage (e.g., GND) corresponding to a logic "0" being on data line 305-1 (D) (and the voltage corresponding to the other logic state being on complementary data line 305-2 (D_)). As shown at is in FIG. 4, the ACT positive control signal goes low and the RNL negative control signal goes low to fire the sense amplifiers. The data value on data lines 305-1 and 305-2 is stored in the primary latch of sense amplifier 306, which may correspond to the data value stored in the selected memory cell, as discussed above.

After the sense amplifier fires with Row Y open, in the pseudo code above, "Close Row Y" indicates that the selected row (e.g., ROW Y) can be disabled, as shown in FIG. 4 at $t_9$. The result of the AND logical operation is not only stored in the sense amplifier 306, but also in the memory cell coupled to Row Y according to the pseudo code above, since Row Y was left open while the sense amplifier 306 is fired. If it is not desired to store the result of the AND logical operation back in the memory cell corresponding to Row Y, the memory cell corresponding to Row Y can be isolated prior to firing the sense amplifier 306 (e.g., by turning-off the access transistor to decouple the selected cell 302 from the data line 305-1 (D)). With the data lines isolated, "Precharge" in the pseudo code above can cause a precharge of the data lines by an equilibrate operation, as described previously and shown in FIG. 4 at $t_{10}$. At $t_{10}$ FIG. 4 also shows that the sense amplifier 306 is disabled by the positive control signal (e.g., ACT) going high and the negative control signal (e.g., RNL) going high. FIG. 4 also shows the conclusion of the equilibrate operation at $t_{11}$, which can correspond to $t_1$ of a next logical operation.

FIG. 4 shows, in the alternative, the behavior of voltage signals on the data lines (e.g., 305-1 (D) and 305-2 (D_) shown in FIG. 3) coupled to the sense amplifier (e.g., 306 shown in FIG. 3) for an AND logical operation involving each of the possible combination of operands (e.g., Row X/Row Y data values 00, 10, 01, and 11).

Figure 5:
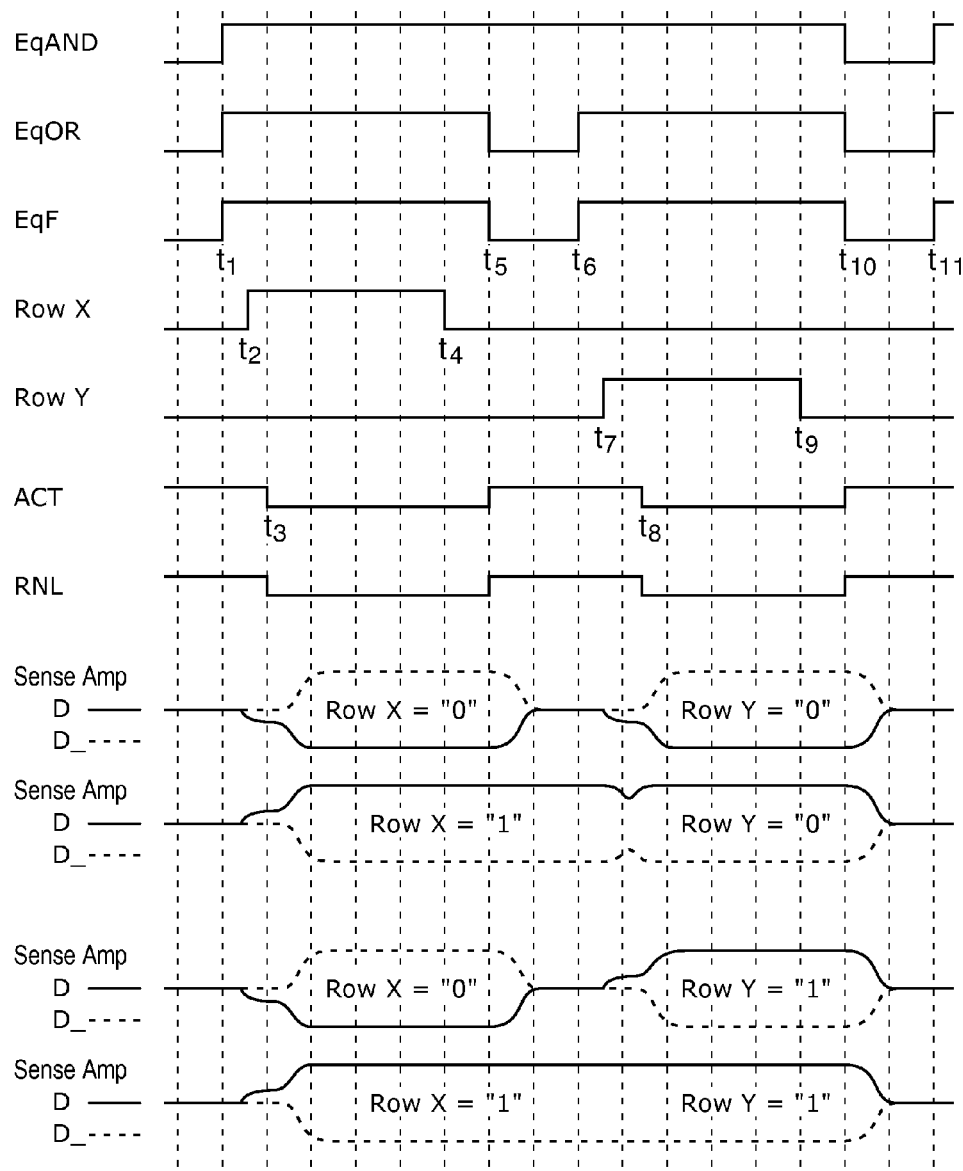
FIG. 5 illustrates a timing diagram associated with performing a number of logical operations using sensing circuitry in accordance with a number of embodiments of the present disclosure.

FIG. 5 illustrates a timing diagram associated with performing a number of logical operations using sensing circuitry in accordance with a number of embodiments of the present disclosure. FIG. 5 illustrates a timing diagram associated with initiating an OR logical operation. FIG. 5 illustrates the sense amplifier signals for various combinations of first and second operand data values. FIG. 5 illustrates the initial and subsequent operation phases associated with performing the OR logical operation. The Row X data value is stored in the sense amplifier 306, which is pre-seeded with the result of the OR logical function based on the data value from Row X, and finally, a second data value (e.g., Row Y) may, or may not, change the OR logical function result pre-seeded in the sense amplifier 306 depending on the data values of each operand.

Pseudo code to implement the OR logical function is the same as that provided above with respect to the AND logical function with the exception that the EqOR control signal is asserted in place of the EqAND control signal discussed above. The timing diagrams illustrated in FIG. 5 reflect these similarities and difference. In referring again to FIG. 2, asserting (e.g., driving the control signal low) the EqOR control signal rather than the EqAND control signal turns-on transistor 236-1 in the equilibration circuitry 214 rather than transistor 236-2. Accordingly, $V_{CC}$ is applied to the gates of transistors 224, 225-1, and 225-2 when the EqOR control signal is asserted and voltages on data lines 305-1 and 305-2 corresponds to a logic "0" (e.g., the data value of Row X is a logic "0"), which causes the data lines 305-1 and 305-2 to equilibrate (e.g., be shorted together and to Vcc/2). Thereafter, when a next memory cell is accessed, the data lines 305-1 and 305-2 voltages will modify based on the charge stored in the next-selected memory cell, reflecting that the result of the OR logical function will be the same as the second operand logic value when the first operand data value is a logic "0."

If the data value of Row X is a logic "1," $V_{CC}$ is not applied to the gates of transistors 224, 225-1, and 225-2 when the EqOR control signal is asserted because the voltage on data line 305-1 (D) is high keeping transistor 238-1 off such that equilibration does not occur after the Row X data value is loaded into the sense amplifier 306. As such, data lines 305-1 and 305-2 retain the full rails voltages corresponding to the Row X data value of a logic "1," which the charge stored in the memory cell coupled to Row Y is not able to flip. The result of an OR logical function will be a logic "1" if the first operand is a logic "1" regardless of the data value of the second operand. Therefore, a logic "1" is retained in the sense amplifier when fired after Row Y is opened (if the Row X data value is a logic "1").

FIG. 5 shows, in the alternative, the behavior of voltage signals on the data lines (e.g., 305-1 (D) and 305-2 (D_) shown in FIG. 3) coupled to the sense amplifier (e.g., 306 shown in FIG. 3) for an OR logical operation involving each of the possible combination of operands (e.g., Row X/Row Y data values 00, 10, 01, and 11).

FIG. 6 is a schematic diagram illustrating sensing circuitry in accordance with a number of embodiments of the present disclosure. The memory array 630 is coupled to sensing circuitry 650-1 in accordance with a number of embodiments of the present disclosure. In this example, the sensing circuitry 650-1 corresponds to respective columns of memory cells (e.g., coupled to respective pairs of complementary data lines 605-1 (D) and 605-2 (D_).

According to various embodiments sensing circuitry 650-1 comprises a sense amplifier 606 and a compute component 631. The sense amplifier 606 can correspond to sense amplifiers 206 described previously with respect to FIG. 2. The sense amplifier 606 can be operated to determine a data value stored in a selected memory cell and/or represented by the voltages present on the complementary data lines 605-1 (D) and 605-2 (D_). As previously discussed, a sense amplifier (e.g., 606) can include a cross coupled latch, which can be referred to herein as a primary latch. Embodiments of sense amplifier 606 are not limited to this example configuration.

As shown in FIG. 6, sensing circuitry 650-1 can be coupled to the memory array 630 via shift circuitry 623-1. According to various embodiments, shift circuitry 623-1 can be configured and operated similar to shift circuitry 323 shown in FIG. 3 except that shift circuitry 623-1 does not include the third pair of isolation transistors (e.g., 321-5 and 321-6 shown in FIG. 3) configured to transpose the data lines to the compute component (e.g., comprising only a sense amplifier in FIG. 3). Shift circuitry 623-1 is configured such that one side of a second pair of isolation transistors is coupled to data lines 605-1 (D) and 605-2 (D_) between the sense amplifier 606 and the first pair of isolation transistors of the shift circuitry 623-1.

Instead, the compute component 631 includes circuitry configured to implement invert functionality. In this example, shift circuitry 623-1 comprises a first pair of isolation transistors operated via a NORM control signal and located between portions of a pair of complementary data lines 605-1 (D) and 605-2 (D_), and a second pair of isolation transistors operated via a SHIFT control signal and configured to couple an different (e.g., adjacent) pair of complementary data lines 605-1 (D) and 605-2 (D_) to the compute component 631.

According to various embodiments, the compute component 631 can comprise inverting circuitry configured to selectively couple a first portion of one of the pair of complementary sense lines to a ground reference and not couple a first portion of another one of the pair of complementary sense lines to the ground reference. As shown in FIG. 6, a first source/drain region of a first invert transistor 607-1 is coupled to a first source/drain region of a first pulldown transistor 609-1. A first source/drain region of a second invert transistor 607-2 is coupled to a first source/drain region of a second pulldown transistor 609-2. A first source/drain region of a first load transistor 618-1 is coupled to a second source/drain region of the first invert transistor 607-1 and a first one of the pair of complementary sense lines (e.g., 605-1 (D)). A second source/drain region of the first load transistor 618-1 is coupled to a gate of the first pulldown transistor 609-1.

A first source/drain region of a second load transistor 618-2 is coupled to a second source/drain region of the second invert transistor 607-2 and a second one of the pair of complementary sense lines (e.g., 605-2 (D_)). A second source/drain region of the second load transistor 618-2 is coupled to a gate of the second pulldown transistor 609-2. A gate of the first load transistor 618-1 is coupled to a gate of the second load transistor 618-2 and to a LOAD control signal line. A second source/drain region of the first pulldown transistor 609-1 and a second source/drain region of the second pulldown transistor 609-2 are coupled to a reference voltage (e.g., ground). A gate of the first invert transistor 607-1 and a gate of the second invert transistor 607-2 are coupled to an INV control signal line.

According to various embodiments, a data value stored in the sense amplifier 606 can be communicated to the respective gates of the pulldown transistors 609-1 or 609-2 by enabling of the load transistors 618-1 and 618-2. Asserting a LOAD control signal (e.g., "Open LOAD") on the LOAD control signal line causes load transistors 618-1 and 618-2 to conduct, which apply a voltage corresponding to a logic "1" (e.g., $V_{CC}$) from one data line of the pair of complementary data lines 605-1 (D) and 605-2 (D_) to the gate of one of the pulldown transistors 609-1 or 609-2, and a voltage corresponding to a logic "0" (e.g., GND) from the other data line of the pair of complementary data lines 605-1 (D) and 605-2 (D_) to the other one of the pulldown transistors 609-1 or 609-2. The result is that the pulldown transistors 609-1 or 609-2 corresponding to the data line having the logic "1" is conducting and the pulldown transistors 609-1 or 609-2 corresponding to the data line having the logic "0" is not conducting. Thereafter, the load transistors 618-1 and 618-2 can be turned-off by removing the LOAD control signal (e.g., "Close LOAD") on the LOAD control signal line.

Once the data value stored in the sense amplifier 606 is loaded to the gates of the pulldown transistors 609-1 and 609-2, the invert transistors 607-1 and 607-2 can be turned-on (e.g., by assertion of the INV control signal via the INV control signal line coupled to the gates of the invert transistors 607-1 and 607-2). As a result, the data line 605-1 (D) or 605-2 that was previously charged to $V_{CC}$ is pulled-down through one set of the invert transistor and pulldown transistor (e.g., 607-1 and 609-1 or 607-2 and 609-2). Firing the sense amplifier during such pull-down causes the sense amplifier 606 to store the inverted data value. Thereafter, the invert transistors 607-1 and 607-2 can be turned-off again by de-asserting the INV control signal. The above-described invert process can occur during or after another logical operation (e.g., ANDing, ORing) such that a one operand or the result can be inverted. An inverted data value can be stored to a selected memory cell by having a selected row open when firing the sense amplifier after pulling down the previously high data line 605-1 or 605-2.

Figure 7:
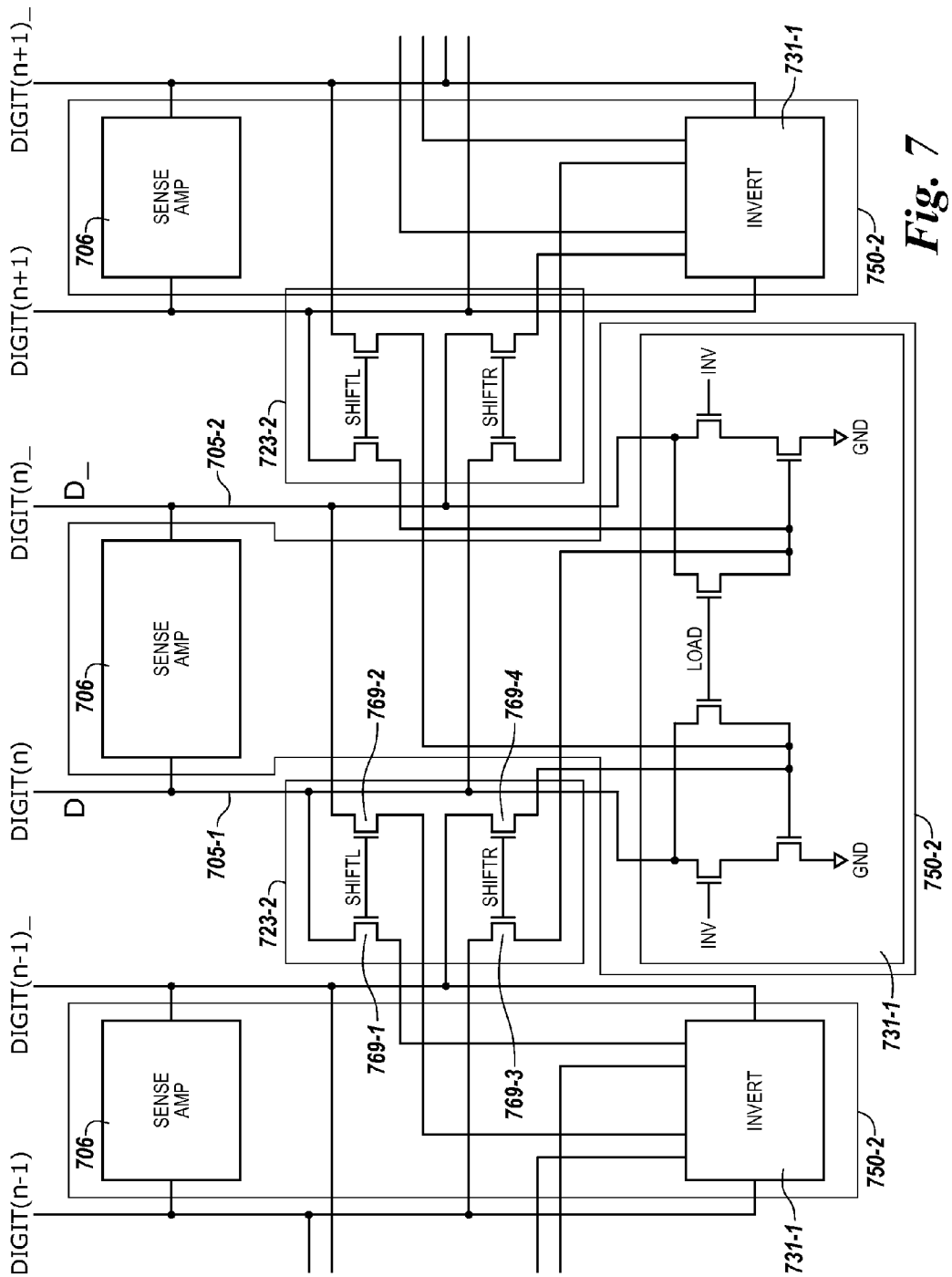
FIG. 7 is a schematic diagram illustrating sensing circuitry in accordance with a number of embodiments of the present disclosure.

FIG. 7 is a schematic diagram illustrating sensing circuitry 750-2 in accordance with a number of embodiments of the present disclosure. The compute component 731-1 can correspond to compute component 631 shown in FIG. 6. However, shift circuitry 723-2 is different in configuration, location, and connection between data lines 705-1 and 705-2 and compute component 731-1 from that shown in FIG. 6 with respect to shift circuitry 623. Shift circuitry 723-2 includes two pairs of isolation transistors configured for bidirectional shifting between data lines, and does not include isolation transistors configured to divide complementary data lines into multiple portions.

According to various embodiments, shift circuitry 723-2 is configured to selectively couple the compute component (e.g., inverting circuitry thereof) to a left-adjacent pair of complementary data lines or a right-adjacent pair of complementary data lines. A gate of a first pulldown transistor can be selectively coupled to an opposite data line of each of the left and right-adjacent pair of complementary data lines from a first data line of the pair of complementary data lines to which the first source/drain region of a first pulldown transistor is coupled through the first invert transistor. A gate of the second pulldown transistor can be selectively coupled to an opposite data line of each of the left and right-adjacent pair of complementary data lines from a second data line of the pair of complementary data lines to which the first source/drain region of a second pulldown transistor is coupled through the second invert transistor.

More particularly, compute component 731-1 is directly coupled to sense amplifier 706. Shift circuitry 723-2 can be located between the sense amplifier 706 and the compute component 731-1. Shift circuitry 723-2 can be directly coupled to portions of data lines 705-1 and 705-2 between the sense amplifier 706 and the compute component 731-1. Shift circuitry 723-2 can be directly coupled, for example, between different pairs of complementary data lines (e.g., between adjacent pairs of complementary data lines).

The shift circuitry 723-2 can include a first pair of isolation transistors 769-1 and 769-2 configured to implement a shift in a first direction (e.g., shift left), and a second pair of isolation transistors 769-3 and 769-4 configured to implement a shift in a second direction (e.g., shift right). For example, FIG. 7 shows that shift circuitry 723-2 can include four shift transistors. Shift transistor 769-1 can be arranged between data line DIGIT(n) and a gate of a pulldown transistor coupled to an adjacent data line DIGIT(n–1)_. Shift transistor 769-2 can be arranged between data line DIGIT(n)_ and a gate of a pulldown transistor coupled to an adjacent data line DIGIT(n–1)_. Gates of shift transistors 769-1 and 769-2 are coupled to a left-shift (e.g., "SHIFTL") control signal line providing a SHIFTL control signal that operates to cause the shift transistors to conduct when asserted.

Shift transistor 769-3 can be arranged between adjacent data line DIGIT(n–1) and the gate of the pulldown transistor coupled to an data line DIGIT(n)_. Shift transistor 769-4 can be arranged between adjacent data line DIGIT(n–1)_ and the gate of the pulldown transistor coupled to data line DIGIT (n). Gates of shift transistors 769-3 and 769-4 are coupled to a right-shift (e.g., "SHIFTR") control signal line providing a SHIFTR control signal that operates to cause the shift transistors to conduct when asserted.

According to various embodiments, the shift transistors of the shift circuitry 723-2 can be transistors rated for a lower voltage than the isolation transistors of shift circuitry 623-1 shown in FIG. 6. For example, the isolation transistors (e.g., used for NORM and SHIFT operations) of shift circuitry 623-1 can be rated to switch between a reference voltage (e.g., ground) and an elevated voltage (e.g., 3 V, which is elevated with respect to the supply voltage of the memory array). The shift transistors of the shift circuitry 723-2 can be rated to switch between a reference voltage (e.g., ground) and a supply voltage (e.g., $V_{CC}$ which may be 1.2V), thus saving power by implementing left-shift and right-shift using the shift circuitry 723-2 configuration provided in the circuit illustrated in FIG. 7. The configuration illustrated in FIG. 7 can also operate faster than the configuration illustrated in FIG. 6 because a Row cycle is not required to accomplish the left-shift and right-shift.

Shift circuitry 723-2 is configured such that a pair of data lines DIGIT (n) and DIGIT(n)_ respectively charged to voltages corresponding to a logic "0" (e.g., data line 705-1 (D) at ground and data line 705-2 (D_) at $V_{CC}$) causes the pulldown transistor coupled to data line DIGIT(n–1)_ to be turned-on, which in turn pulls-down data line DIGIT(n–1)_, and does not cause the pulldown transistor coupled to data line DIGIT(n–1) to be turned-on, which in turn does not pull-down data line DIGIT(n–1). That is, shift circuitry 723-2 is not configured to merely directly couple adjacent pairs of data lines (e.g., data line-to-data line and complementary data line-to-complementary data line). Additionally, shift circuitry 723-2 is configured such that a pair of data lines DIGIT (n–1) and DIGIT(n–1)_ respectively charged to voltages corresponding to a logic "1" (e.g., data line 705-1 (D) at $V_{CC}$ and data line 705-2 (D_) at ground) causes the pulldown transistor coupled to data line DIGIT (n)_ to be turned-on, which in turn pulls-down data line DIGIT(n)_, and does not cause the pulldown transistor coupled to data line DIGIT(n) to be turned-on, which in turn does not pull-down data line DIGIT(n).

The invert transistors and load transistors of compute circuitry 731-1 are operated in conjunction with the shift transistors of shift circuitry 723-2 to accomplish the above-described directional shifting. The shift transistors, invert transistors, and load transistors are all operated simultaneously to accomplish the above-described pull-down of data lines to reflect the voltages to which adjacent data lines are charged.

Figure 8:
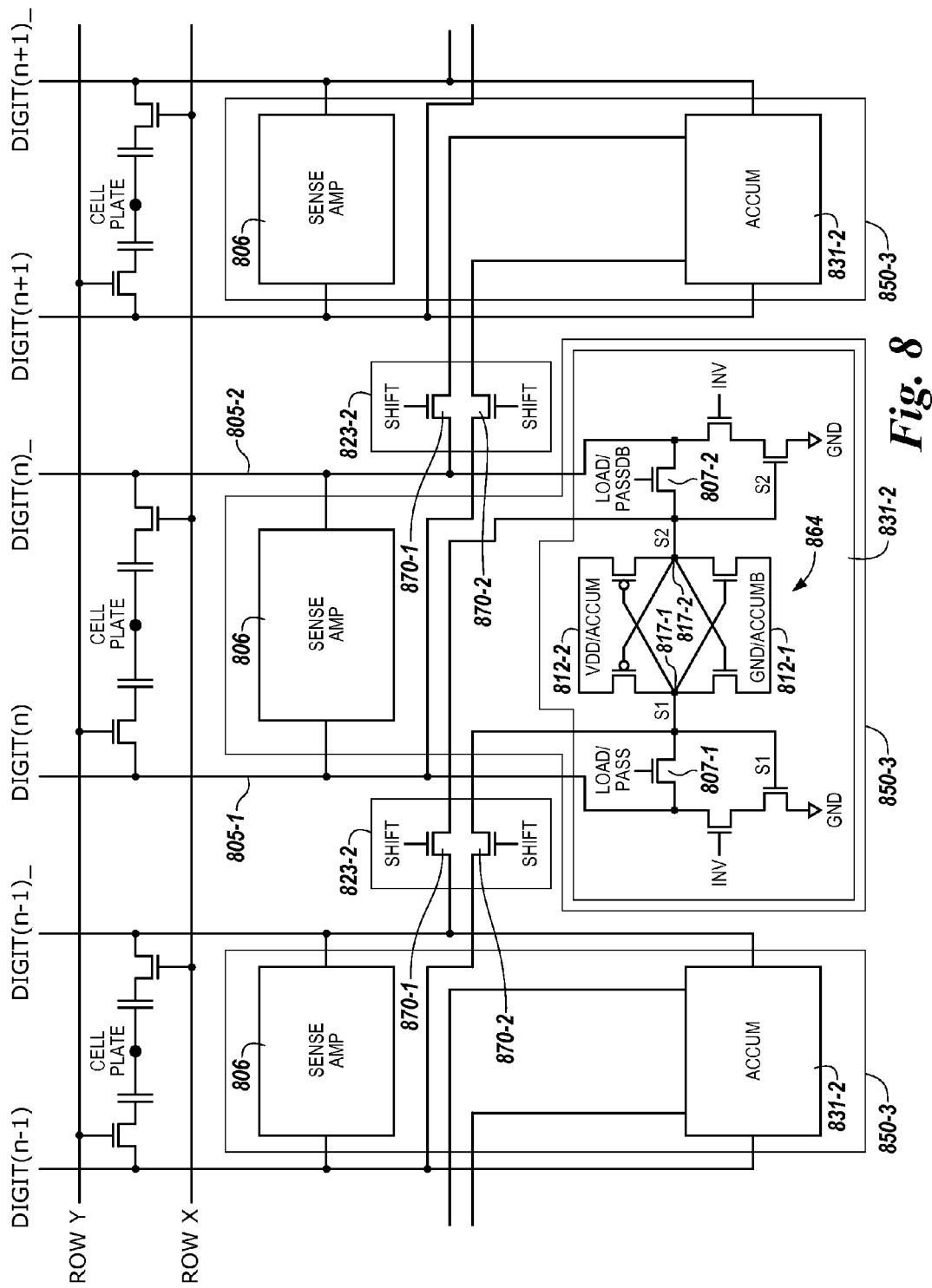
FIG. 8 is a schematic diagram illustrating sensing circuitry in accordance with a number of embodiments of the present disclosure.

FIG. 8 is a schematic diagram illustrating sensing circuitry 850-3 in accordance with a number of embodiments of the present disclosure. The circuit illustrated in FIG. 8 is similar to the circuit illustrated in FIG. 7 with two exceptions. First, the compute component 831-2 includes a latch 864 (e.g., secondary latch) and therefore can serve as, and be referred to herein as, an accumulator, which can be operated in conjunction with sense amplifier 806 to implement logical operations. Second, the shift circuitry 823-2 includes a single pair of isolation transistors 870-1 and 870-2, which can be operated in conjunction with the load/pass transistors 807-1 and 807-2 to implement bidirectional shifting.

Load transistors are constructed to handle loading associated with coupling data lines to the nodes of the secondary latch (e.g., S1 and S2), for example. Pass transistors are constructed to handle heavier loading associated with coupling data lines to an adjacent accumulator (e.g., through the shift circuitry 823-2, as shown in FIG. 8). According to some embodiments, load/pass transistors 807-1 and 807-2 can be configured to accommodate the heavier loading corresponding to a pass transistor but be coupled and operated as a load transistor. Load/pass transistors 807-1 and 807-2 configured as pass transistors can also be utilized as load transistors. However, load/pass transistors 807-1 and 807-2 configured as load transistors may not be capable of being utilized as pass transistors.

Compute component 831-2 includes a latch 864 having a first input node 817-1 (S1) and a second input node 817-2 (S2). According to various embodiments of the present disclosure, latch 864 can be configured as a static latch (e.g., a cross-coupled latch as is shown in FIG. 8). However, embodiments of the present disclosure are not so limited, and latch 864 can be implemented, for example, as a dynamic latch. However, utilization of a static latch 864, such as a cross-coupled latch, can provide an improved soft error rate over use of a dynamic latch as the secondary latch. According to some embodiments, latch 864 can be a cross-coupled latch implemented similar to that shown in FIG. 2 by transistors 227-1, 227-2, 229-1, and 229-2 for the secondary latch in the sense amplifier. Latch 864 can be implemented with positive and negative control signals (e.g., through pull-up and pull-down transistors configured similar to transistors 211 and 213 shown in FIG. 2), or can be implemented to be continuously enabled by coupling the common source/drains of the PMOS transistors to $V_{CC}$ and coupling the common source/drains of the NMOS transistors to ground, as shown in FIG. 8.

Load/pass transistors 807-1 and 807-2 can be operated to load a data value from data lines DIGIT(n)/DIGIT(n)_ into latch 864 (or onto data lines DIGIT(n)/DIGIT(n)_ from latch 864). Isolation transistors 870-1 and 870-2 can be operated to load a data value from adjacent data lines DIGIT(n−1)/DIGIT(n−1)_ into latch 864 (or onto data lines DIGIT(n−1)/DIGIT(n−1)_ from latch 864).

According to various embodiments of the present disclosure, isolation transformer 870-1 can correspond to isolation transistor 769-3 shown in FIG. 7, and isolation transformer 870-2 can correspond to isolation transistor 769-4 shown in FIG. 7. That is, isolation transistors 870-1 and 870-2 are coupled between a compute component (e.g., compute component 831-2 associated with data lines DIGIT(n)/DIGIT(n)_) and an adjacent pair of complementary data lines (e.g., data lines DIGIT(n−1)/DIGIT(n−1)_) and operated to shift-right a state of an adjacent pair of complementary data lines by pulling-down one data line based on the voltages to which the adjacent pair of complementary data lines (e.g., pulling-down the complement data line of the data line from the adjacent pair that is charged to a voltage greater than the equilibrate voltage, as described in further detail with respect to FIG. 7.

The invert, pulldown, and load transistors of compute component 831-2 can be operated to pull-down, and thus invert, a data line as described with respect to FIG. 7. However, with respect to the configuration shown in FIG. 8 for compute component 831-2, the data value stored in latch 864 will be inverted along with data lines DIGIT(n)/DIGIT(n)_ since the load/pass transistors 807-1 and 807-2 are conducting during an invert process and latch 864 is continuously enabled in being coupled to $V_{CC}$ and ground.

The circuit illustrated in FIG. 8 can accomplish a shift function by using the secondary latch 864 of the compute component 831-2 and the primary latch of the sense amplifier 806 in a master-slave configuration. According to embodiments of the present disclosure, operations to shift right a Row X data value can be summarized as follows:

---

Activate Shift
    Sense amplifier data is written into the secondary latch one to the right.
Deactivate Shift
Equilibrate (EQ) data lines
Deactivate EQ
Activate LOAD (shifted data from the secondary latch is written onto the data lines)
Fire Sense amplifiers (after which shifted data resides in the sense amplifiers)
Deactivate LOAD

---

The "Activate Shift" shown in the pseudo code above indicates that the SHIFT control signal goes high, which causes the isolation transistors (e.g., 870-1 and 870-2) to conduct to couple an adjacent pair of complementary data lines (e.g., left-adjacent data lines DIGIT(n−1)/DIGIT(n−1)_) to the secondary latch 864. The pair of complementary data lines (e.g., DIGIT(n)/DIGIT(n)_) corresponding to the compute component 831-2 are isolated from compute component 831-2 because load/pass transistors 807-1 and 807-2 are not conducting.

After the shifted right Row X data value from the left-adjacent pair of complementary data lines is stored in secondary latch 864, the "Deactivate Shift" shown in the pseudo code above indicates that the SHIFT control signal goes low, which causes the shift transistors (e.g., 870-1 and 870-2) to stop conducting and isolate the left-adjacent pair of complementary data lines from compute component 831-2.

Once the left-adjacent pair of complementary data lines are isolated from compute component 831-2, the "Equilibrate (EQ) data lines" shown in the pseudo code above indicates that the pairs of complementary data lines (e.g., DIGIT(n)/DIGIT(n)_) can be equilibrated in a same manner as described previously for "Precharge" pseudo code operations. After equilibrating the pairs of complementary data lines, the "Disable EQ" shown in the pseudo code above indicates that the equilibration corresponding to the sense amplifier 806 is disabled (e.g., no longer shorted together and to Vcc/2).

After equilibration is complete, the data value stored in the secondary latch 864 can be copied to the sense amplifier 806. The "Activate LOAD" shown in the pseudo code above indicates that the LOAD control signal goes high, which causes load/pass transistors 807-1 and 807-2 to conduct, which couples the secondary latch 864 to the pair of complementary data lines (e.g., DIGIT(n)/DIGIT(n)_). This places the data value stored in the secondary latch on the pair of complementary data lines.

Thereafter, the "Fire Sense amplifiers" shown in the pseudo code above indicates that the data value on the pair of complementary data lines (e.g., DIGIT(n)/DIGIT(n)_) is stored in the sense amplifier 806. Once the data value is stored in the sense amplifier 806, the "Deactivate LOAD" shown in the pseudo code above indicates that the LOAD control signal goes low, which causes load/pass transistors 807-1 and 807-2 to stop conducting and isolates the secondary latch 864 from the pair of complementary data lines and the sense amplifier 806.

Operations to shift left a Row X data value can be summarized as follows:

---

Activate LOAD
    Sense amplifier data is written into the corresponding accumulator.
Deactivate LOAD
Activate EQ (to equilibrate data lines)
Deactivate EQ
Activate SHIFT
    Fire Sense amplifiers (after which shifted data resides in the sense amplifiers corresponding to left-adjacent data lines)
Deactivate SHIFT

---

The "Activate LOAD" shown in the pseudo code above indicates that the LOAD control signal goes high, which causes load/pass transistors 807-1 and 807-2 to conduct, thereby coupling the secondary latch 864 to the pair of complementary data lines (e.g., DIGIT(n)/DIGIT(n)_) having the Row X data value thereon. This operation places the Row X data value in the secondary latch 864 from the pair of complementary data lines. In this manner, a data value stored in the sense amplifier 806 can be copied into the corresponding compute circuit 831-2 (e.g., coupled to the same data lines as the sense amplifier).

After the Row X data value is stored in the secondary latch 864, the "Equilibrate (EQ) data lines" shown in the pseudo code above indicates that the pairs of complementary data lines can be equilibrated in a same manner as described previously for "Precharge" pseudo code operations. After equilibrating the pairs of complementary data lines, the "Deactivate EQ" shown in the pseudo code above indicates that the equilibration signals corresponding to sense amplifier 806 are deactivated (e.g., such that the complementary data lines are no longer shorted together and to Vcc/2).

After equilibration is complete, the "Activate SHIFT" shown in the pseudo code above indicates that the SHIFT control signal goes high, which causes the shift transistors (e.g., 870-1 and 870-2) of the shift circuitry to conduct thereby coupling the secondary latch 864 of the compute component 831-2 to the left-adjacent pair of complementary data lines DIGIT(n−1)/DIGIT(n−1)_), as well as to the sense amplifier 806 of the left-adjacent sensing circuitry 850-3. The pair of complementary data lines DIGIT(n)/DIGIT(n)_ corresponding to the compute component 831-2 are isolated from compute component 831-2 because load/pass transistors 807-1 and 807-2 are not conducting.

Once the secondary latch is coupled to the left-adjacent pair of complementary data lines, the "Fire Sense amplifiers" shown in the pseudo code above indicates that the data value on the pair of complementary data lines is stored in the left-adjacent sense amplifier 806, in a manner previously described for storing a data value in a sense amplifier.

After the shifted left Row X data value from the pair of complementary data lines is stored in the left-adjacent sense amplifier 806, the "Deactivate Shift" shown in the pseudo code above indicates that the SHIFT control signal goes low, which causes the shift transistors (e.g., 870-1 and 870-2) of the shift circuitry 823-2 to stop conducting and isolate the pair of complementary data lines from the right-adjacent compute component 831-2.

After the shifted left Row X data value from the pair of complementary data lines is stored in the right-adjacent sense amplifier 806, the "Deactivate SHIFT" shown in the pseudo code above indicates that the SHIFT control signal goes low, which causes the shift transistors (e.g., 870-1 and 870-2) to stop conducting and isolate the pair of complementary data lines from the right-adjacent compute component 831-2.

The above-described shift cycle is faster than previously-described shift cycles since a Row cycle can be eliminated. Power can be reduced because a Row is not opened; thus, there is no associated charging and discharging of the memory cells. Power can also be reduced from the circuit configuration shown in FIG. 3 with a shift circuitry 323 because an elevated voltage (e.g., 3.0 V) is applied to the isolation transistors of the shift circuitry 323 shown in FIG. 3, whereas $V_{CC}$ (e.g., 1.2 V) is utilized in implementing SHIFT functionality using the circuit illustrated in FIG. 8.

As mentioned above, the latch 864 of compute component 831-2 can function as an accumulator and be operated in conjunction with sense amplifier 806 to implement logical operations. These operations are described below for sensing circuitry 850-3 with respect to the timing diagrams illustrated in FIGS. 9-12.

Figure 9:
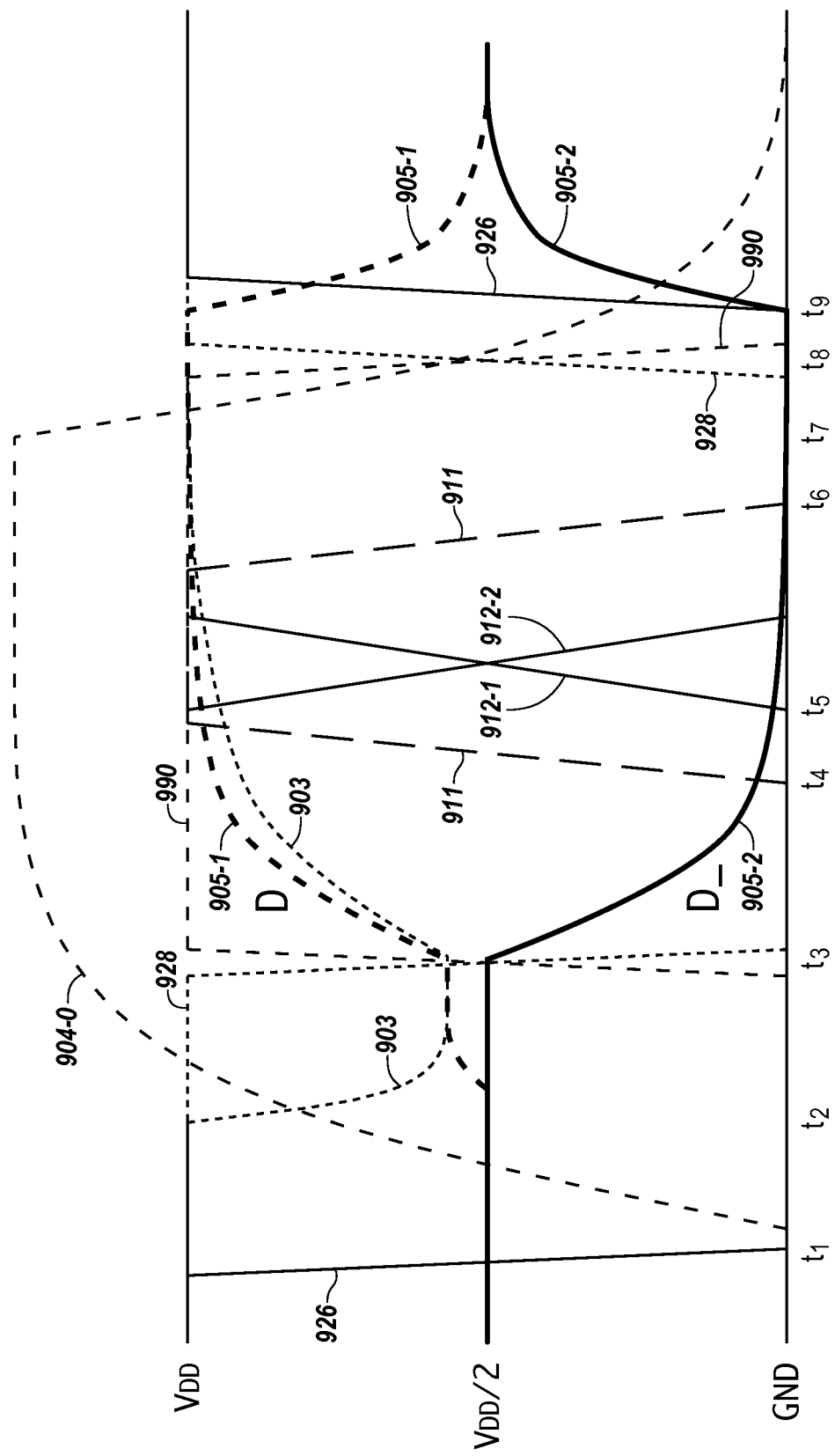
FIG. 9 illustrates a timing diagram associated with performing a number of logical operations using sensing circuitry in accordance with a number of embodiments of the present disclosure.

FIG. 9 illustrates a timing diagram associated with performing a number of logical operations using sensing circuitry in accordance with a number of embodiments of the present disclosure. The timing diagram shown in FIG. 9 illustrates signals (e.g., voltage signals) associated with performing a first operation phase of a logical operation (e.g., an R-input logical operation). The first operation phase described with respect to FIG. 9 can be a first operation phase of an AND, NAND, OR, or NOR operation, for instance. Performing the operation phase illustrated in FIG. 9 can involve consuming significantly less energy (e.g., about half) than previous processing approaches that may involve providing a full swing between voltage rails (e.g., between a supply and ground).

In the example illustrated in FIG. 9, the voltage rails corresponding to complementary logic values (e.g., "1" and "0") are a supply voltage ($V_{CC}$) and a reference voltage (e.g., ground (Gnd)). Prior to performing a logical operation, an equilibration can occur such that the complementary data lines D and D_ are shorted together at an equilibration voltage ($V_{CC}/2$), as previously described.

The first operation phase of a logical operation described below involves loading a first operand of the logical operation into the accumulator. The time references (e.g., $t_1$, etc.) shown in FIG. 9 do not necessarily represent a same absolute or relative time as similar time references in other timing diagrams. At time $t_1$, the equilibration signal 926 is deactivated, and then a selected row is enabled (e.g., the row corresponding to a memory cell whose data value is to be sensed and used as a first input). Signal 904-0 represents the voltage signal applied to the selected row of memory cells. When row signal 904-0 reaches the threshold voltage (Vt) of the access transistor corresponding to the selected cell, the access transistor turns on and couples the data line D to the selected memory cell (e.g., to the capacitor if the cell is a 1T1C DRAM cell), which creates a differential voltage signal between the data lines (e.g., 805-1 (D) and 805-2 (D_) shown in FIG. 8) (e.g., as indicated by signals 905-1 and 905-2 on the data lines, respectively) between times $t_2$ and $t_3$. The voltage of the selected cell is represented by signal 903. Due to conservation of energy, creating the differential signal between data lines 805-1 (D) and 805-2 (D_) (e.g., by coupling the cell to data line D) does not consume energy, since the energy associated with enabling/disabling the row signal 904-0 can be amortized over the plurality of memory cells coupled to the row.

At time $t_3$, the sense amplifier (e.g., 806 shown in FIG. 8) is enabled by control signal 990 (e.g., ACT shown in FIG. 2) goes low and the negative control signal 928 (e.g., RNL shown in FIG. 2) goes low, which amplifies the differential signal between data lines 805-1 (D) and 805-2 (D_), resulting in a voltage (e.g., $V_{CC}$) corresponding to a logic "1" or a voltage (e.g., ground) corresponding to a logic "0" being on data line D (and the other voltage being on complementary data line D_), such that the sensed data value is stored in the primary latch of sense amplifier 806. The primary energy consumption occurs in charging the data line 805-1 (D) from the equilibration voltage $V_{CC}/2$ to the rail voltage $V_{CC}$.

According to some embodiments, the primary latch of sense amplifier 806 can be coupled to the complementary data lines D and D_ through respective sense amplifier pass transistors (e.g., a second set of pass transistors between the sense amplifier 806 and the complementary data lines D and D_). Sense amplifier pass transistors, through which one node (e.g., S1) of the primary latch of sense amplifier 806 is coupled to the data line D can be controlled by a PASSD control signal 911 and the sense amplifier pass transistor through which another node (e.g., S2) of the primary latch of sense amplifier 806 is coupled to the data line D_ can be controlled by a PASSDB control signal, which can behave here the same as the PASSD control signal.

At time $t_4$, the sense amplifier pass transistors can be enabled (e.g., via respective PASSD and PASSDB control signals applied to control lines coupled to the respective gates of the sense amplifier pass transistors. At time $t_5$, accumulator control signals 912-1 (e.g., ACCUM) and 912-2 (e.g., ACCUMB) are activated via respective control lines 812-1 and 812-2 (e.g., where the accumulator is not constantly enabled by coupling control line 812-1 to GND and coupling control line 812-2 to $V_{DD}$). As described below, the accumulator control signals 912-1 and 912-2 may remain activated for subsequent operation phases. As such, in this example, activating the ACCUMB and ACCUM control signals 912-1 and 912-2 enables the secondary latch (e.g., serving as an accumulator) of compute component 831. The sensed data value stored in sense amplifier 806 is transferred (e.g., copied) to the secondary latch 864-S.

At time $t_6$, the sense amplifier pass transistors are disabled (e.g., turned off) by the PASSD and PASSDB control signals 911 going low. However, since the accumulator control signals 912-1 and 912-2 remain activated, an accumulated result is stored (e.g., latched) in the secondary latch (e.g., serving as an accumulator). At time $t_7$, the row signal 904-0 is deactivated, and the array sense amplifiers are disabled at time $t_8$ (e.g., control signals 928 and 990 enabling the sense amplifier are deactivated).

At time $t_9$, the data lines D and D_ are equilibrated (e.g., equilibration signal 926 is activated), as illustrated by data line voltage signals 905-1 and 905-2 moving from their respective rail values to the equilibration voltage ($V_{CC}/2$). The equilibration consumes little energy due to the law of conservation of energy. As described previously in association with FIG. 2, equilibration can involve shorting the complementary data lines D and D_ together at an equilibration voltage, which is $V_{CC}/2$, in this example. Equilibration can occur, for instance, prior to a memory cell sensing operation.

Figure 10:
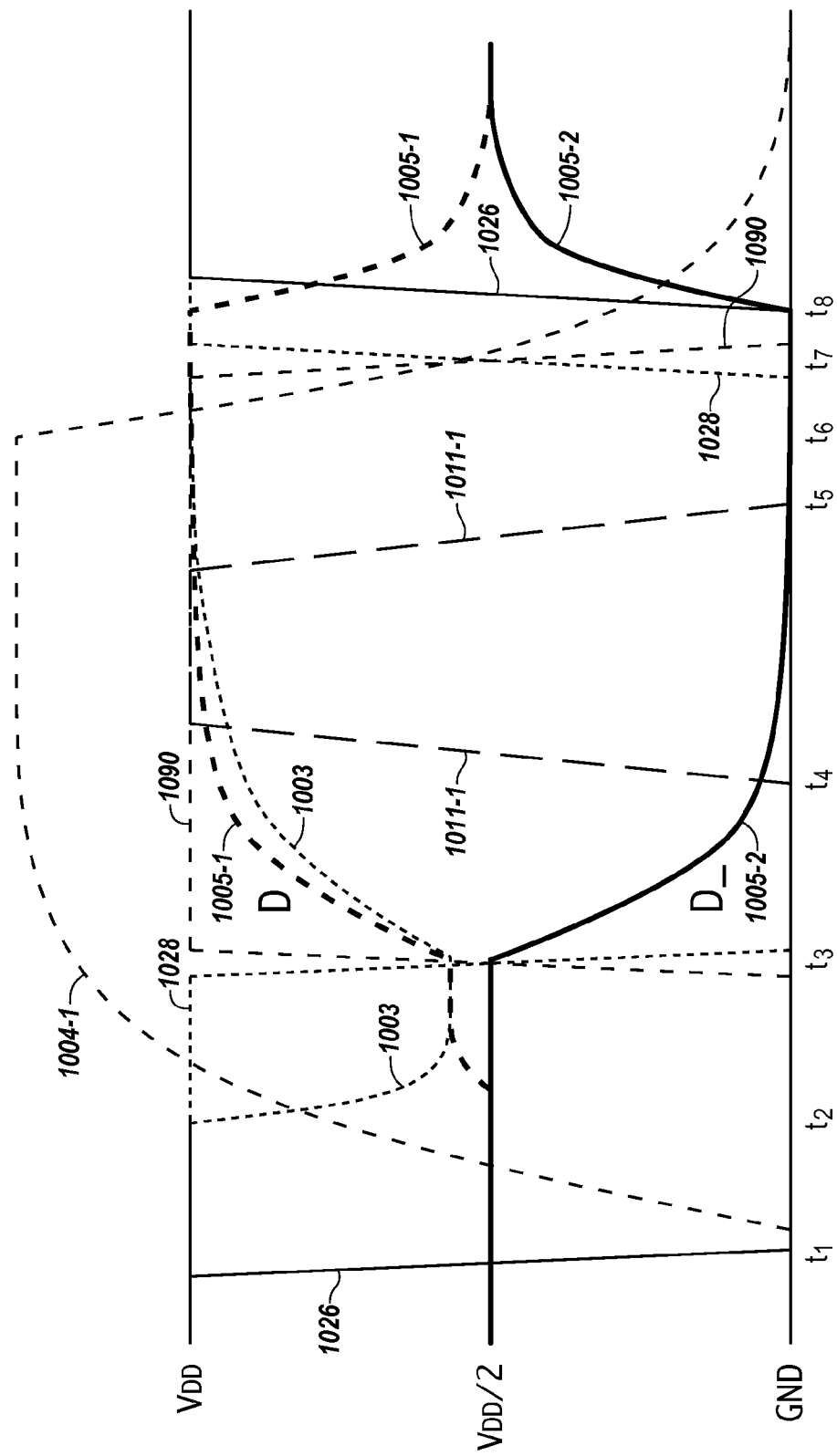
FIG. 10 illustrates a timing diagram associated with performing a number of logical operations using sensing circuitry in accordance with a number of embodiments of the present disclosure.
Figure 11:
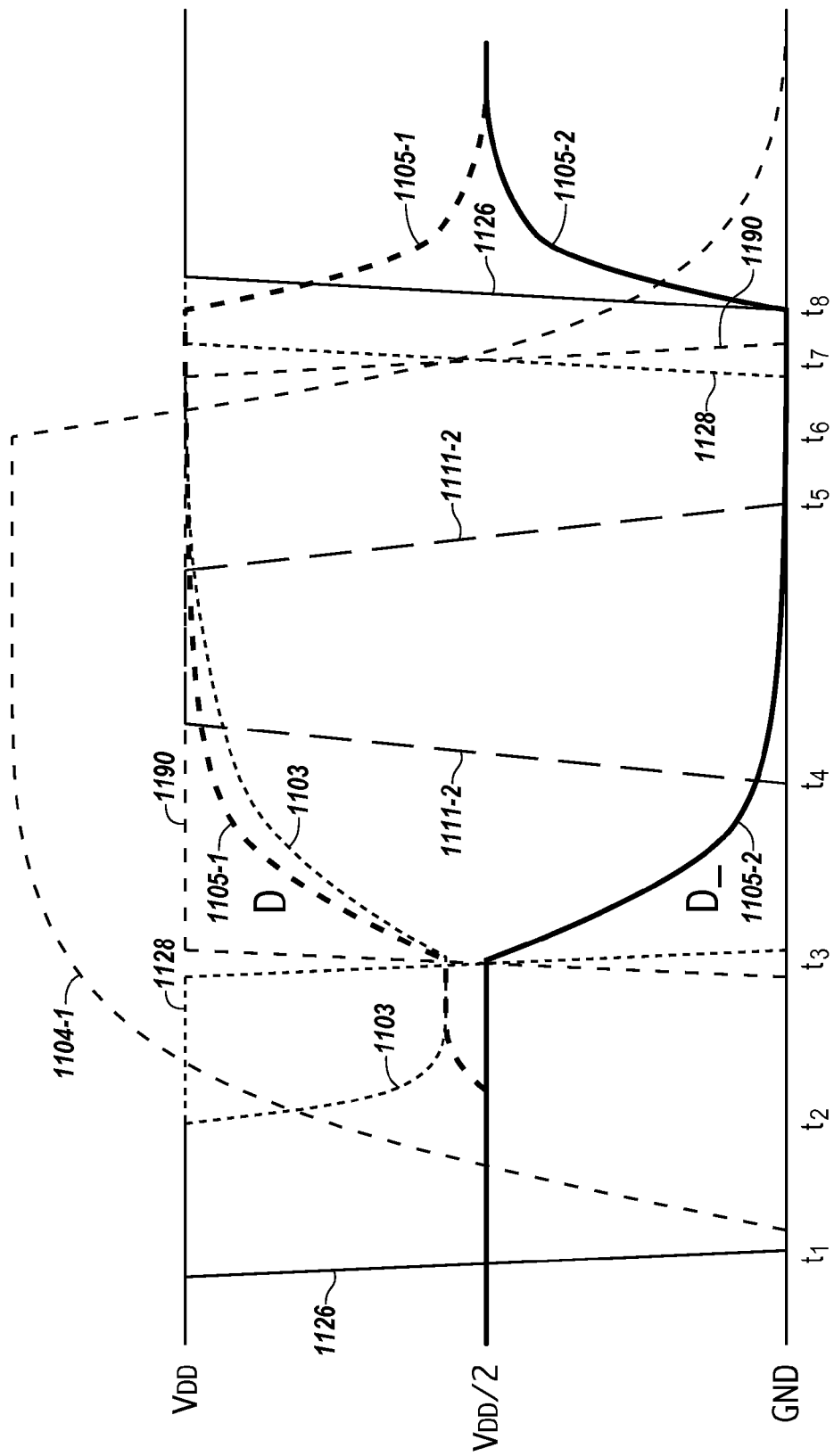
FIG. 11 illustrates a timing diagram associated with performing a number of logical operations using sensing circuitry in accordance with a number of embodiments of the present disclosure.

FIGS. 10 and 11 respectively illustrate timing diagrams associated with performing a number of logical operations using sensing circuitry in accordance with a number of embodiments of the present disclosure. Timing diagrams shown in FIGS. 10 and 11 illustrate signals (e.g., voltage signals) associated with performing a number of intermediate operation phases of a logical operation (e.g., an R-input logical operation). For instance, timing diagram shown in FIG. 4 corresponds to a number of intermediate operation phases of an R-input NAND operation or an R-input AND operation, and timing diagram shown in FIG. 5 corresponds to a number of intermediate operation phases of an R-input NOR operation or an R-input OR operation. For example, performing an AND or NAND operation can include performing the operation phase shown in FIG. 10 one or more times subsequent to an initial operation phase such as that described with respect to FIG. 9. Similarly, performing an OR or NOR operation can include performing the operation phase shown and described with respect to FIG. 11 one or more times subsequent to an initial operation phase such as that described with respect to FIG. 9.

As shown in the timing diagrams illustrated in FIGS. 10 and 11, at time $t_1$, equilibration is disabled (e.g., the equilibration signal 1026/1126 is deactivated), and then a selected row is enabled (e.g., the row corresponding to a memory cell whose data value is to be sensed and used as an input such as a second input, third input, etc.). Signal 1004-1/1104-1 represents the voltage signal applied to the selected row. When row signal 1004-1/1104-1 reaches the threshold voltage (Vt) of the access transistor corresponding to the selected cell, the access transistor turns on and couples the data line D to the selected memory cell (e.g., to the capacitor if the cell is a 1T1C DRAM cell), which creates a differential voltage signal between the data lines D and D_ (e.g., as indicated by signals 1005-1/1105-1 and 1005-2/1105-2, respectively) between times $t_2$ and $t_3$. The voltage of the selected cell is represented by signal 1003/1103. Due to conservation of energy, creating the differential signal between D and D_ (e.g., by coupling the cell to data line D) does not consume energy, since the energy associated with activating/deactivating the row signal 1004-1/1104-1 can be amortized over the plurality of memory cells coupled to the row.

At time $t_3$, the sense amplifier (e.g., 806 shown in FIG. 8) is enabled (e.g., a positive control signal 1090/1190 (e.g., corresponding to ACT 290 shown in FIG. 2) goes low, and the negative control signal 1028/1128 (e.g., RNL 228 shown in FIG. 2) goes low), which amplifies the differential signal between D and D_, resulting in a voltage (e.g., $V_{CC}$) corresponding to a logic "1" or a voltage (e.g., ground) corresponding to a logic "0" being on data line D (and the other voltage being on complementary data line D_), such that the sensed data value is stored in the primary latch of sense amplifier 806. The primary energy consumption occurs in charging the data line D (805-1) from the equilibration voltage $V_{CC}/2$ to the rail voltage $V_{CC}$.

As shown in timing diagrams illustrated in FIGS. 10 and 11, at time $t_4$ (e.g., after the selected cell is sensed), only one of control signals 1011-1 (PASSD) shown in FIGS. 10 and 1111-2 (PASSDB) shown in FIG. 11 is activated (e.g., only one of pass transistors (if present) is enabled), depending on the particular logic operation. For example, since the timing diagram illustrated in FIG. 10 corresponds to an intermediate phase of a NAND or AND operation, control signal 1011-1 (PASSD) is activated at time t₄ to turn on the pass transistor coupling the primary latch to data line D and the PASSDB control signal remains deactivated leaving the pass transistor coupling the primary latch to data line D turned off Conversely, since the timing diagram illustrated in FIG. 11 corresponds to an intermediate phase of a NOR or OR operation, control signal 1111-2 (PASSDB) is activated at time t4 to turn on the pass transistor coupling the primary latch to data line D_ and control signal PASSD remains deactivated leaving the pass transistor coupling the primary latch to data line D turned off. Recall from above that the accumulator control signals 912-1 (Accumb) and 912-2 (Accum) were activated during the initial operation phase described with respect to FIG. 9, and they remain activated during the intermediate operation phase(s).

Since the accumulator was previously enabled, activating only PASSD (1011-1 as shown in FIG. 10) results in accumulating the data value corresponding to the voltage signal 1005-1 shown in FIG. 10 corresponding to data line D. Similarly, activating only PASSDB (1111-2 as shown in FIG. 11) results in accumulating the data value corresponding to the voltage signal 1105-2 corresponding to data line D_. For instance, in an example AND/NAND operation shown in the timing diagram illustrated in FIG. 4 in which only PASSD (1011-1) is activated, if the data value stored in the second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 11 in which only PASSDB 1111-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 1105-2 on D_ is setting the true data value of the accumulator.

At the conclusion of an intermediate operation phase such as that shown in FIG. 10 or 11, the PASSD signal 1011-1 (e.g., for AND/NAND) or the PASSDB signal 1111-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 10 or 11 can be repeated in order to accumulate results from a number of additional rows. As an example, the sequence of timing diagram illustrated in FIGS. 10 and/or 11 can be performed a subsequent (e.g., second) time for a third memory cell, a subsequent (e.g., third) time for a fourth memory cell, etc. For instance, for a 10-input NOR operation, the intermediate phase shown in FIG. 11 can occur 9 times to provide 9 inputs of the 10-input logical operation, with the tenth input being determined during the initial operation phase (e.g., as described with respect to FIG. 9).

Figure 12:
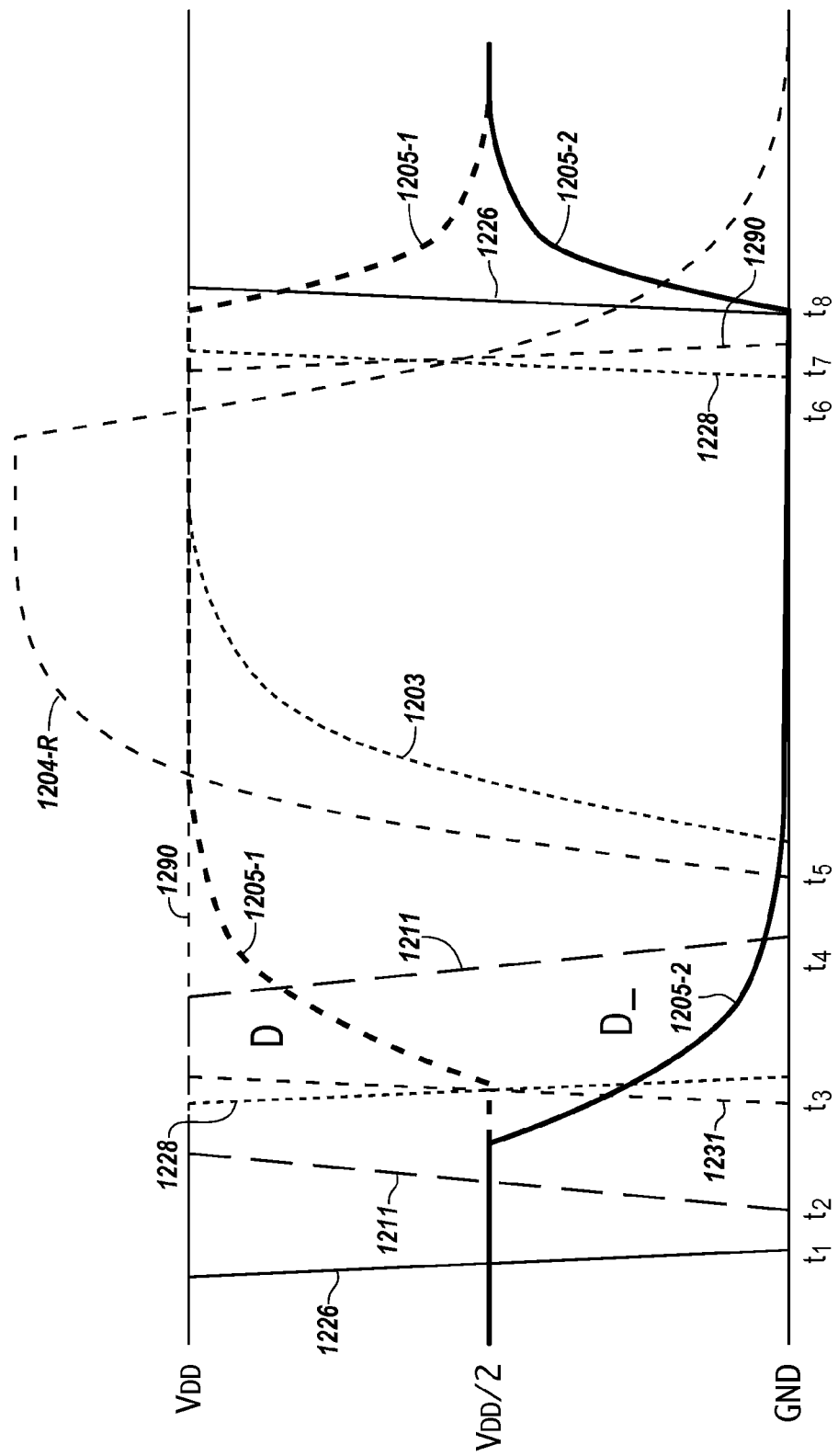
FIG. 12 illustrates a timing diagram associated with performing a number of logical operations using sensing circuitry in accordance with a number of embodiments of the present disclosure.

FIG. 12 illustrates a timing diagram associated with performing a number of logical operations using sensing circuitry in accordance with a number of embodiments of the present disclosure. The timing diagram illustrated in FIG. 12 shows signals (e.g., voltage signals) associated with performing a last operation phase of a logical operation (e.g., an R-input logical operation). For instance, the timing diagram illustrated in FIG. 12 corresponds to a last operation phase of an R-input AND operation or an R-input OR operation.

For example, performing a last operation phase of an R-input can include performing the operation phase shown in FIG. 12 subsequent to a number of iterations of the intermediate operation phase(s) described in association with FIGS. 10 and/or 11. Table 1 shown below indicates the Figures corresponding to the sequence of operation phases associated with performing a number of R-input logical operations in accordance with a number of embodiments described herein.

TABLE 1

| Operation | FIG. 9 | FIG. 10 | FIG. 11 | FIG. 12 |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

The last operation phase illustrated in the timing diagram of FIG. 12 is described in association with storing a result of an R-input logical operation to a row of the array. However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 12, at time t₁, equilibration is disabled (e.g., the equilibration signal 1226 is deactivated) such that data lines D and D_ are floating. At time t2, the PASSD control signal 1211 (and PASSDB signal) is activated for an AND or OR operation.

Activating the PASSD control signal 1211 (and PASSDB signal) (e.g., in association with an AND or OR operation) transfers the accumulated output stored in the secondary latch 864 of compute component 831-1 shown in FIG. 8 to the primary latch of sense amplifier 806. For instance, for an AND operation, if any of the memory cells sensed in the prior operation phases (e.g., the first operation phase illustrated in FIG. 9 and one or more iterations of the intermediate operation phase illustrated in FIG. 10) stored a logic "0" (e.g., if any of the R-inputs of the AND operation were a logic "0"), then the data line D_ will carry a voltage corresponding to logic "1" (e.g., $V_{CC}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1".

At time t3, the primary latch of sense amplifier 806 is then enabled (e.g., a positive control signal 1290 (e.g., corresponding to ACT 290 shown in FIG. 2) goes low and the negative control signal 1228 (e.g., corresponding to RNL 228 shown in FIG. 2) goes low), which amplifies the differential signal between data lines D and D such that the data line D now carries the ANDed result of the respective input data values as determined from the memory cells sensed during the prior operation phases. As such, data line D will be at ground if any of the input data values are a logic "0" and data line D will be at $V_{CC}$ if all of the input data values are a logic "1."

For an OR operation, if any of the memory cells sensed in the prior operation phases (e.g., the first operation phase of FIG. 9 and one or more iterations of the intermediate operation phase shown in FIG. 11) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{CC}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 806 is then enabled and the data line D now carries the ORed result of the respective input data values as determined from the memory cells sensed during the prior operation phases. As such, data line D will be at $V_{CC}$ if any of the input data values are a logic "1" and data line D will be at ground if all of the input data values are a logic "0."

The result of the R-input AND or OR logical operations can then be stored back to a memory cell of array 130 shown in FIG. 1. In the examples shown in FIG. 12, the result of the R-input logical operation is stored to a memory cell coupled to the last row opened (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 12 show, at time t3, the positive control signal 1290 and the negative control signal 1228 being deactivated (e.g., signal 1290 goes high and signal 1228 goes low) to disable the sense amplifier 806 shown in FIG. 8. At time t4 the PASSD control signal 1211 (and PASSDB signal) that was activated at time t2 is deactivated. Embodiments are not limited to this example. For instance, in a number of embodiments, the sense amplifier 806 shown in FIG. 8 may be enabled subsequent to time t4 (e.g., after the PASSD control signal 1211 (and PASSDB signal) are deactivated).

As shown in FIG. 12, at time t5, a selected row is enabled (e.g., by row enabling signal 1204 going high, which drives the capacitor of the selected cell to the voltage corresponding to the logic value stored in the accumulator. At time t6 the selected row is disabled. At time t7 the sense amplifier 806 shown in FIG. 8 is disabled (e.g., positive control signal 1228 and negative control signal 1290 are deactivated), and at time t8 equilibration occurs (e.g., signal 1226 is activated and the voltages on the complementary data lines 1205-1 (D) and 1205-2 (D_) are brought to the equilibration voltage).

Although the example of performing a last operation phase of an R-input was discussed above with respect to FIG. 12 for performing AND and OR logical operations, embodiments are not limited to these logical operations. For example, the NAND and NOR operations can also involve a last operation phase of an R-input that is stored back to a memory cell of array 130 (shown in FIG. 1) using control signals to operate the sensing circuitry illustrated in FIG. 8.

Figure 13:
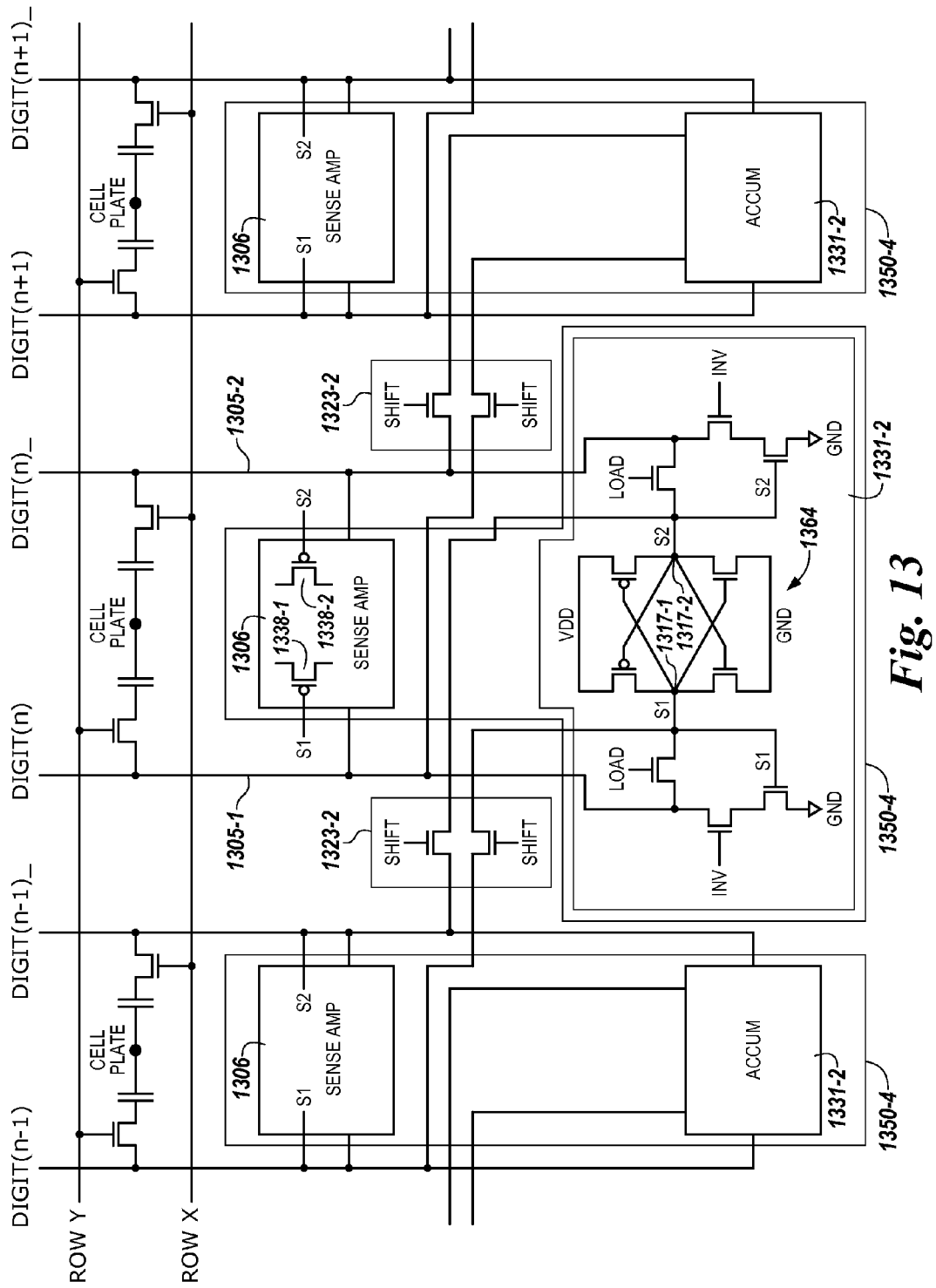
FIG. 13 is a schematic diagram illustrating sensing circuitry in accordance with a number of embodiments of the present disclosure.

FIG. 13 is a schematic diagram illustrating sensing circuitry 1350-4 in accordance with a number of embodiments of the present disclosure. The sensing circuitry 1350-4 and shift circuitry 1323-2 shown in FIG. 13 is the same as the sensing circuitry 850-3 and shift circuitry 823-2 shown in FIG. 8 with one exception. That is, shift circuitry 1323-2 corresponds to shift circuitry 823-2 shown in FIG. 8, and sensing circuitry 1350-4 corresponds to sensing circuitry 850-3 shown in FIG. 8 with one difference described below.

According to various embodiments of the present disclosure, sense amplifier 1306 corresponds to sense amplifier 806 except that the input controls for the equilibrate circuitry are coupled to the gut nodes (e.g., first input 1317-1 (S1) and 1317-2 (S2)) of the secondary latch 1364 rather than to the data lines 1305-1 (D) and 1305-2 (D_). More particularly, the gates of transistors 1338-1 and 1338-2 (which correspond to transistors 238-1 and 238-2 shown for the sense amplifier 206 illustrated in FIG. 2) are coupled to the gut nodes (e.g., first input 1317-1 (S1) and 1317-2 (S2)) of the secondary latch 1364. These connections are also shown with respect to sense amplifiers 1406 illustrated in FIG. 14. This configuration provides full rail signals (e.g., $V_{CC}$ or ground) to the equilibrate circuitry, and can therefore be more robust than the configuration shown with respect to sensing circuitry 850-3 illustrated in FIG. 8.

Figure 14:
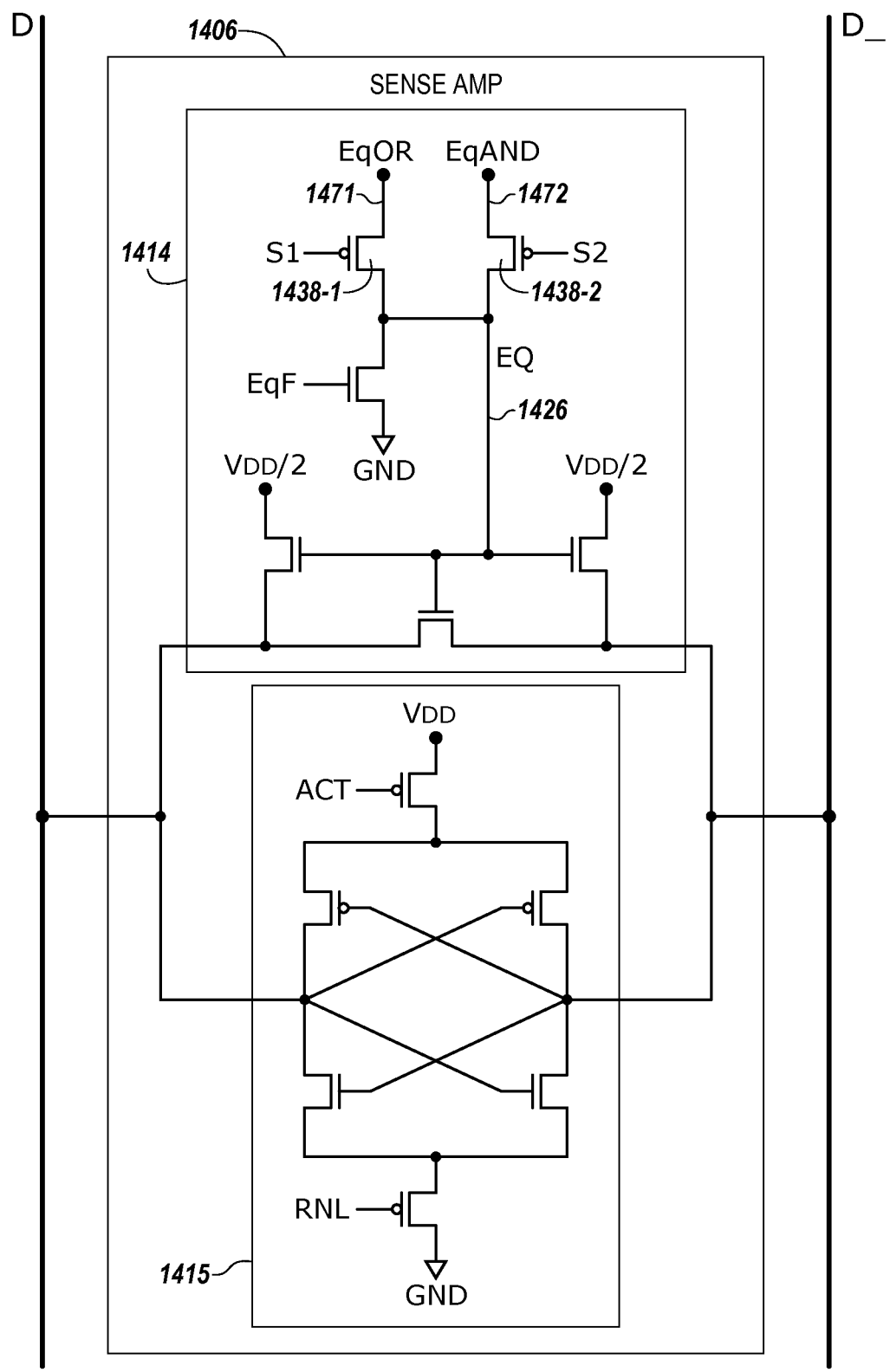
FIG. 14 is a schematic diagram illustrating a portion of sensing circuitry in accordance with a number of embodiments of the present disclosure.

FIG. 14 is a schematic diagram illustrating a portion of sensing circuitry in accordance with a number of embodiments of the present disclosure. In this example, the portion of sensing circuitry comprises a sense amplifier 1406. In a number of embodiments, sense amplifier 1406 can correspond to a modified sense amplifier 1306 shown in FIG. 13 (which can correspond to a modified version of sense amplifier 206 shown and described with respect to FIG. 2). Sense amplifier 1406 shows that the gates of transistors 1438-1 and 1438-2 (which correspond to transistors 1338-1 and 1338-2 shown in FIG. 13) are coupled to the gut nodes (e.g., S1 and S2) of the secondary latch, as described with respect to FIG. 13. This is different than the connections shown for transistors 238-1 and 238-2 shown in FIG. 2.

Furthermore, sense amplifier 1406 shows one source/drain of transistor 1438-1 coupled to an EqOR control signal line 1471, rather than through a transistor having a gate coupled to the EqOR control signal line (e.g., 236-1 shown in FIG. 2). Sense amplifier 1406 also shows one source/drain of transistor 1438-2 coupled to an EqAND control signal line 1472, rather than through a transistor having a gate coupled to the EqAND control signal line (e.g., 236-2 shown in FIG. 2). The EqOR and EqAND can provide control signals that can be asserted to $V_{CC}$. The configuration of sense amplifier 1406 uses two fewer transistors than sense amplifier 1306, and also uses less power than sense amplifier 1306 because there is less capacitance to charge and discharge in precharge cycles. The alternate connection of the equilibration circuitry to the EqOR and EqAND shown for sense amplifier 1406 can be utilized in sense amplifier 306 shown in FIG. 3, for sense amplifier 606 shown in FIG. 6, for sense amplifier 706 shown in FIG. 7, for sense amplifier 806 shown in FIG. 8, and for sense amplifier 1306 shown in FIG. 13.

Figure 15:
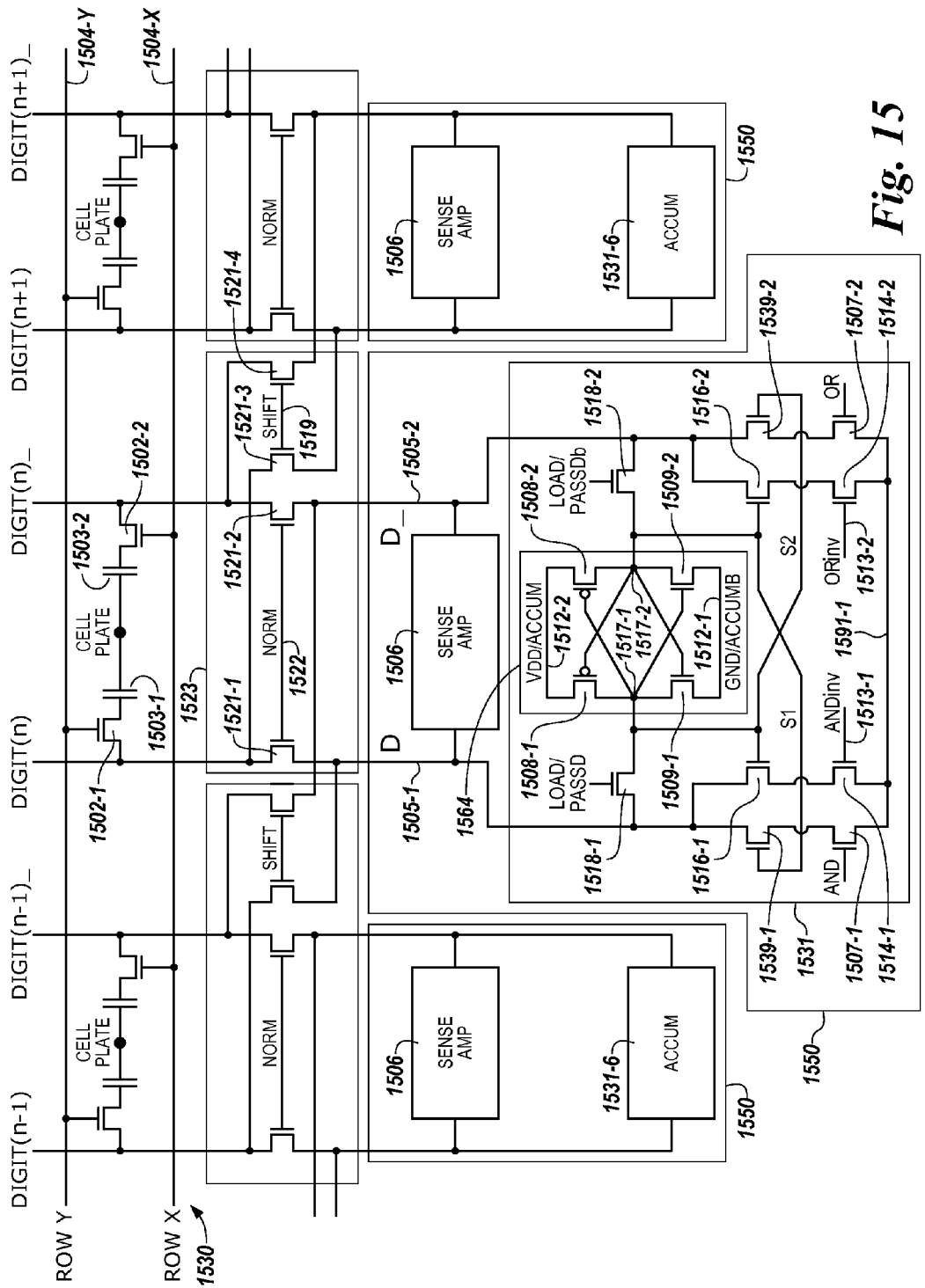
FIG. 15 is a schematic diagram illustrating sensing circuitry in accordance with a number of embodiments of the present disclosure.

FIG. 15 is a schematic diagram illustrating sensing circuitry in accordance with a number of embodiments of the present disclosure. A memory cell comprises a storage element (e.g., capacitor) and an access device (e.g., transistor). For instance, transistor 1502-1 and capacitor 1503-1 comprises a memory cell, and transistor 1502-2 and capacitor 1503-2 comprises a memory cell, etc. In this example, the memory array 1530 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 1530 are arranged in rows coupled by word lines 1504-X (Row X), 1504-Y (Row Y), etc., and columns coupled by pairs of complementary data lines DIGIT(n−1)/ DIGIT(n−1)_, DIGIT(n)/DIGIT(n)_, DIGIT(n+1)/DIGIT(n+1)_. The individual data lines corresponding to each pair of complementary data lines can also be referred to as data lines 1505-1 (D) and 1505-2 (D_) respectively. Although only three pair of complementary data lines are shown in FIG. 15, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 1502-1 can be coupled to data line 1505-1 (D), a second source/drain region of transistor 1502-1 can be coupled to capacitor 1503-1, and a gate of a transistor 1502-1 can be coupled to word line 1504-X. A first source/drain region of a transistor 1502-2 can be coupled to data line 1505-2 (D_), a second source/drain region of transistor 1502-2 can be coupled to capacitor 1503-2, and a gate of a transistor 1502-2 can be coupled to word line 1504-Y. The cell plate, as shown in FIG. 15, can be coupled to each of capacitors 1503-1 and 1503-2. The cell plate can be a common node to which a reference voltage (e.g., ground) can be applied in various memory array configurations.

The memory array 1530 is coupled to sensing circuitry 1550 in accordance with a number of embodiments of the present disclosure. In this example, the sensing circuitry 1550 comprises a sense amplifier 1506 and a compute component 1531 corresponding to respective columns of memory cells (e.g., coupled to respective pairs of complementary data lines). The sense amplifier 1506 can comprise a cross coupled latch, which can be referred to herein as a primary latch. The sense amplifier 1506 can be configured, for example, as described with respect to FIG. 16.

In the example illustrated in FIG. 15, the circuitry corresponding to compute component 1531 comprises a static latch 1564 and an additional ten transistors that implement, among other things, a dynamic latch. The dynamic latch and/or static latch of the compute component 1531 can be collectively referred to herein as a secondary latch, which can serve as an accumulator. As such, the compute component 1531 can operate as and/or be referred to herein as an accumulator. The compute component 1531 can be coupled to each of the data lines D 1505-1 and D_ 1505-2 as shown in FIG. 15. However, embodiments are not limited to this example. The transistors of compute component 1531 can all be re-channel transistors (e.g., NMOS transistors), for example.

In this example, data line D 1505-1 can be coupled to a first source/drain region of transistors 1516-1 and 1539-1, as well as to a first source/drain region of load/pass transistor 1518-1. Data line D_ 1505-2 can be coupled to a first source/drain region of transistors 1516-2 and 1539-2, as well as to a first source/drain region of load/pass transistor 1518-2.

The gates of load/pass transistor 1518-1 and 1518-2 can be commonly coupled to a LOAD control signal, or respectively coupled to a PASSD/PASSDB control signal, as discussed further below. A second source/drain region of load/pass transistor 1518-1 can be directly coupled to the gates of transistors 1516-1 and 1539-2. A second source/drain region of load/pass transistor 1518-2 can be directly coupled to the gates of transistors 1516-2 and 1539-1.

A second source/drain region of transistor 1516-1 can be directly coupled to a first source/drain region of pull-down transistor 1514-1. A second source/drain region of transistor 1539-1 can be directly coupled to a first source/drain region of pull-down transistor 1507-1. A second source/drain region of transistor 1516-2 can be directly coupled to a first source/drain region of pull-down transistor 1514-2. A second source/drain region of transistor 1539-2 can be directly coupled to a first source/drain region of pull-down transistor 1507-2. A second source/drain region of each of pull-down transistors 1507-1, 1507-2, 1514-1, and 1514-2 can be commonly coupled together to a reference voltage line 1591-1 (e.g., ground (GND)). A gate of pull-down transistor 1507-1 can be coupled to an AND control signal line, a gate of pull-down transistor 1514-1 can be coupled to an ANDinv control signal line 1513-1, a gate of pull-down transistor 1514-2 can be coupled to an ORinv control signal line 1513-2, and a gate of pull-down transistor 1507-2 can be coupled to an OR control signal line.

The gate of transistor 1539-1 can be referred to as node S1, and the gate of transistor 1539-2 can be referred to as node S2. The circuit shown in FIG. 15 stores accumulator data dynamically on nodes S1 and S2. Activating the LOAD control signal causes load/pass transistors 1518-1 and 1518-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 15 is not contingent on the LOAD control signal being elevated to a voltage greater than $V_{DD}$.

The configuration of compute component 1531 shown in FIG. 15 has the benefit of balancing the sense amplifier for functionality when the pull-down transistors 1507-1, 1507-2, 1514-1, and 1514-2 are conducting before the sense amplifier 1506 is fired (e.g., during pre-seeding of the sense amplifier 1506). As used herein, firing the sense amplifier 1506 refers to enabling the sense amplifier 1506 to set the primary latch and subsequently disabling the sense amplifier 1506 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 1516-1 (having a gate coupled to S2 of the dynamic latch) in series with transistor 1514-1 (having a gate coupled to an ANDinv control signal line 1513-1) can be operated to pull-down data line 1505-1 (D), and transistor 1516-2 (having a gate coupled to S1 of the dynamic latch) in series with transistor 1514-2 (having a gate coupled to an ANDinv control signal line 1513-2) can be operated to pull-down data line 1505-2 (D_).

The latch 1564 can be controllably enabled by coupling to an active negative control signal line 1512-1 (ACCUMB) and an active positive control signal line 1512-2 (ACCUM) rather than be configured to be continuously enabled by coupling to ground and $V_{DD}$. In various embodiments, load/pass transistors 1508-1 and 1508-2 can each having a gate coupled to one of a LOAD control signal or a PASSD/PASSDB control signal.

According to some embodiments, the gates of load/pass transistors 1518-1 and 1518-2 can be commonly coupled to a LOAD control signal. In the configuration where the gates of load/pass transistors 1518-1 and 1518-2 are commonly coupled to the LOAD control signal, transistors 1518-1 and 1518-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 15 is not contingent on the LOAD control signal being elevated to a voltage greater than $V_{DD}$.

According to some embodiments, the gate of load/pass transistor 1518-1 can be coupled to a PASSD control signal, and the gate of load/pass transistor 1518-2 can be coupled to a PASSDb control signal. In the configuration where the gates of transistors 1518-1 and 1518-2 are respectively coupled to one of the PASSD and PASSDb control signals, transistors 1518-1 and 1518-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 1523, as shown in FIG. 15). According to some embodiments, load/pass transistors 1518-1 and 1518-2 can be configured to accommodate the heavier loading corresponding to a pass transistor but be coupled and operated as a load transistor. Load/pass transistors 1518-1 and 1518-2 configured as pass transistors can also be utilized as load transistors. However, load/pass transistors 1518-1 and 1518-2 configured as load transistors may not be capable of being utilized as pass transistors.

In a number of embodiments, the compute component 1531, including the latch 1564, can comprise a number of transistors formed on pitch with the transistors of the corresponding memory cells of an array (e.g., array 1530 shown in FIG. 15) to which they are coupled, which may conform to a particular feature size (e.g., $4F^2$, $6F^2$, etc.). According to various embodiments, latch 1564 includes four transistors 1508-1, 1508-2, 1509-1, and 1509-2 coupled to a pair of complementary data lines D 1505-1 and D_ 1505-2 through load/pass transistors 1518-1 and 1518-2. However, embodiments are not limited to this configuration. The latch 1564 can be a cross coupled latch (e.g., gates of a pair of transistors, such as n-channel transistors (e.g., NMOS transistors) 1509-1 and 1509-2 are cross coupled with the gates of another pair of transistors, such as p-channel transistors (e.g., PMOS transistors) 1508-1 and 1508-2). As described further herein, the cross coupled latch 1564 can be referred to as a static latch.

The voltages or currents on the respective data lines D and D_ can be provided to the respective latch inputs 1517-1 and 1517-2 of the cross coupled latch 1564 (e.g., the input of the secondary latch). In this example, the latch input 1517-1 is coupled to a first source/drain region of transistors 1508-1 and 1509-1 as well as to the gates of transistors 1508-2 and 1509-2. Similarly, the latch input 1517-2 can be coupled to a first source/drain region of transistors 1508-2 and 1509-2 as well as to the gates of transistors 1508-1 and 1509-1.

Figure 16:
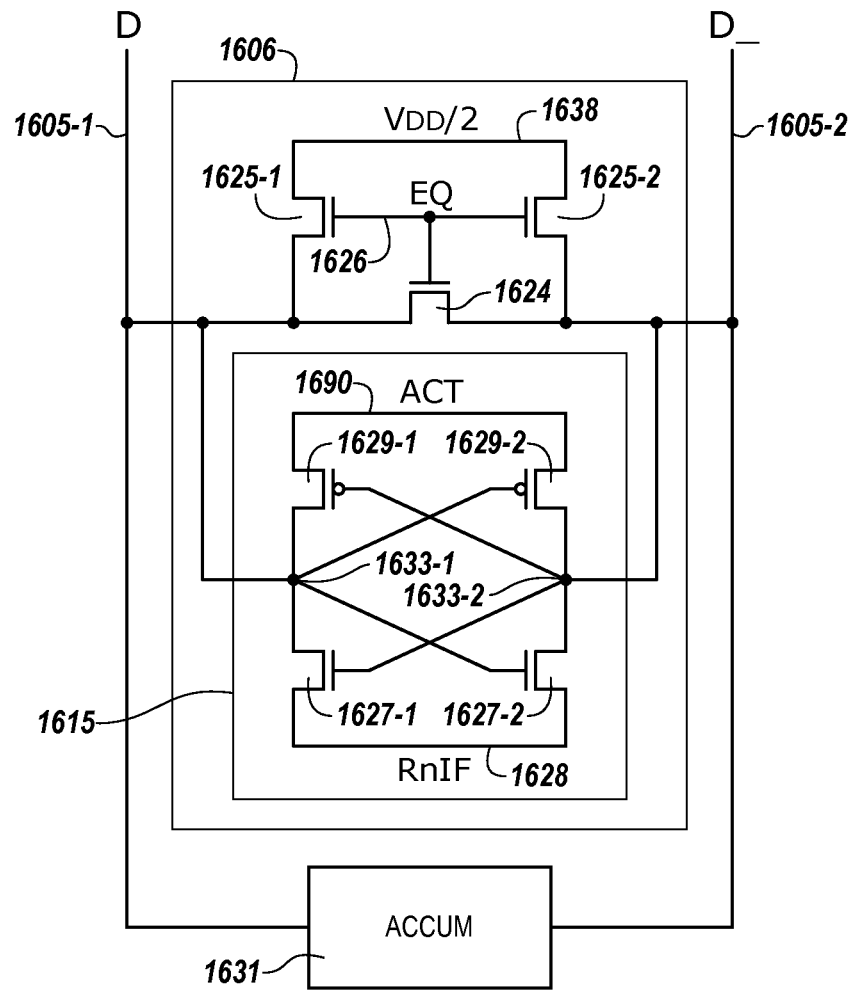
FIG. 16 is a schematic diagram illustrating a portion of sensing circuitry in accordance with a number of embodiments of the present disclosure.

In this example, a second source/drain region of transistor 1509-1 and 1509-2 is commonly coupled to a negative control signal line 1512-1 (e.g., ground (GND) or ACCUMB control signal similar to control signal RnIF shown in FIG. 16 with respect to the primary latch). A second source/drain region of transistors 1508-1 and 1508-2 is commonly coupled to a positive control signal line 1512-2 (e.g., $V_{DD}$ or ACCUM control signal similar to control signal ACT shown in FIG. 16 with respect to the primary latch). The positive control signal 1512-2 can provide a supply voltage (e.g., $V_{DD}$) and the negative control signal 1512-1 can be a reference voltage (e.g., ground) to enable the cross coupled latch 1564. According to some embodiments, the second source/drain region of transistors 1508-1 and 1508-2 are commonly coupled directly to the supply voltage (e.g., $V_{DD}$), and the second source/drain region of transistor 1509-1 and 1509-2 are commonly coupled directly to the reference voltage (e.g., ground) so as to continuously enable latch 1564.

The enabled cross coupled latch 1564 operates to amplify a differential voltage between latch input 1517-1 (e.g., first common node) and latch input 1517-2 (e.g., second common node) such that latch input 1517-1 is driven to either the activated positive control signal voltage (e.g., $V_{DD}$) or the activated negative control signal voltage (e.g., ground), and latch input 1517-2 is driven to the other of the activated positive control signal voltage (e.g., $V_{DD}$) or the activated negative control signal voltage (e.g., ground).

FIG. 16 is a schematic diagram illustrating a portion of sensing circuitry in accordance with a number of embodiments of the present disclosure. According to various embodiments, sense amplifier 1606 (e.g., corresponding to sense amplifier 1506 shown in FIG. 15) can comprise a cross coupled latch. However, embodiments of the sense amplifier 1606 are not limited to a cross coupled latch. As an example, the sense amplifier 1606 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 1606) can comprise a number of transistors formed on pitch with the transistors of the corresponding compute component 1631 and/or the memory cells of an array (e.g., 1530 shown in FIG. 15) to which they are coupled, which may conform to a particular feature size (e.g., $4F^2$, $6F^2$, etc.). The sense amplifier 1606 comprises a latch 1615 including four transistors coupled to a pair of complementary data lines D 1605-1 and D_ 1605-2. The latch 1615 can be a cross coupled latch (e.g., gates of a pair of transistors, such as n-channel transistors (e.g., NMOS transistors) 1627-1 and 1627-2 are cross coupled with the gates of another pair of transistors, such as p-channel transistors (e.g., PMOS transistors) 1629-1 and 1629-2). As described further herein, the latch 1615 comprising transistors 1627-1, 1627-2, 1629-1, and 1629-2 can be referred to as a primary latch. However, embodiments are not limited to this example.

The voltages or currents on the respective data lines D and D_ can be provided to the respective latch inputs 1633-1 and 1633-2 of the cross coupled latch 1615 (e.g., the input of the secondary latch). In this example, the latch input 1633-1 is coupled to a first source/drain region of transistors 1627-1 and 1629-1 as well as to the gates of transistors 1627-2 and 1629-2. Similarly, the latch input 1633-2 can be coupled to a first source/drain region of transistors 1627-2 and 1629-2 as well as to the gates of transistors 1627-1 and 1629-1. The compute component 1633 (e.g., serving as an accumulator) can be coupled to latch inputs 1633-1 and 1633-2 of the cross coupled latch 1615 as shown; however, embodiments are not limited to the example shown in FIG. 16.

In this example, a second source/drain region of transistor 1627-1 and 1627-2 is commonly coupled to an active negative control signal 1628 (RnIF) A second source/drain region of transistors 1629-1 and 1629-2 is commonly coupled to an active positive control signal 1690 (ACT). The ACT signal 1690 can be a supply voltage (e.g., $V_{DD}$) and the RnIF signal can be a reference voltage (e.g., ground). Activating signals 1628 and 1690 enables the cross coupled latch 1615.

The enabled cross coupled latch 1615 operates to amplify a differential voltage between latch input 1633-1 (e.g., first common node) and latch input 1633-2 (e.g., second common node) such that latch input 1633-1 is driven to one of the ACT signal voltage and the RnIF signal voltage (e.g., to one of $V_{DD}$ and ground), and latch input 1633-2 is driven to the other of the ACT signal voltage and the RnIF signal voltage.

The sense amplifier 1606 can also include circuitry configured to equilibrate the data lines D and D_ (e.g., in association with preparing the sense amplifier for a sensing operation). In this example, the equilibration circuitry comprises a transistor 1624 having a first source/drain region coupled to a first source/drain region of transistor 1625-1 and data line D 1605-1. A second source/drain region of transistor 1624 can be coupled to a first source/drain region of transistor 1625-2 and data line D_ 1605-2. A gate of transistor 1624 can be coupled to gates of transistors 1625-1 and 1625-2.

The second source drain regions of transistors 1625-1 and 1625-2 are coupled to an equilibration voltage 1638 (e.g., $V_{DD}/2$), which can be equal to $V_{DD}/2$, where $V_{DD}$ is a supply voltage associated with the array. The gates of transistors 1624, 1625-1, and 1625-2 can be coupled to control signal 1625 (EQ). As such, activating EQ enables the transistors 1624, 1625-1, and 1625-2, which effectively shorts data line D to data line D_ such that the data lines D and D_ are equilibrated to equilibration voltage $V_{DD}/2$. According to various embodiments of the present disclosure, a number of logical operations can be performed using the sense amplifier, and storing the result in the compute component (e.g., serving as an accumulator).

As shown in FIG. 15, the sense amplifier 1506 and the compute component 1531 can be coupled to the array 1530 via shift circuitry 1523. In this example, the shift circuitry 1523 comprises a pair of isolation devices (e.g., isolation transistors 1521-1 and 1521-2) coupled to data lines 1505-1 (D) and 1505-2 (D_), respectively. The isolation transistors 1521-1 and 1521-2 are coupled to a control signal 1522 (NORM) that, when activated, enables (e.g., turns on) the isolation transistors 1521-1 and 1521-2 to couple the corresponding sense amplifier 1506 and compute component 1531 to a corresponding column of memory cells (e.g., to a corresponding pair of complementary data lines 1505-1 (D) and 1505-2 (D_)). According to various embodiments, conduction of isolation transistors 1521-1 and 1521-2 can be referred to as a "normal" configuration of the shift circuitry 1523.

In the example illustrated in FIG. 15, the shift circuitry 1523 includes another (e.g., a second) pair of isolation devices (e.g., isolation transistors 1521-3 and 1521-4) coupled to a complementary control signal 1519 (SHIFT), which can be activated, for example, when NORM is deactivated. The isolation transistors 1521-3 and 1521-4 can be operated (e.g., via control signal 1519) such that a particular sense amplifier 1506 and compute component 1531 are coupled to a different pair of complementary data lines (e.g., a pair of complementary data lines different than the pair of complementary data lines to which isolation transistors 1521-1 and 1521-2 couple the particular sense amplifier 1506 and compute component 1531), or can couple a particular sense amplifier 1506 and compute component 1531 to another memory array (and isolate the particular sense amplifier 1506 and compute component 1531 from a first memory array). According to various embodiments, the shift circuitry 1523 can be arranged as a portion of (e.g., within) the sense amplifier 1506, for instance.

Although the shift circuitry 1523 shown in FIG. 15 includes isolation transistors 1521-1 and 1521-2 used to couple particular sensing circuitry 1550 (e.g., a particular sense amplifier 1506 and corresponding compute component 1531) to a particular pair of complementary data lines 1505-1 (D) and 1505-2 (D_) (e.g., DIGIT(n) and DIGIT(n)_) and isolation transistors 1521-3 and 1521-4 are arranged to couple the particular sensing circuitry 1550 to an adjacent pair of complementary data lines in one particular direction (e.g., adjacent data lines DIGIT(n+1) and DIGIT (n+1)_ shown to the right in FIG. 15), embodiments of the present disclosure are not so limited. For instance, shift circuitry can include isolation transistors 1521-1 and 1521-2 used to couple particular sensing circuitry to a particular pair of complementary data lines (e.g., DIGIT(n) and DIGIT(n)_ and isolation transistors 1521-3 and 1521-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 15).

Embodiments of the present disclosure are not limited to the configuration of shift circuitry 1523 shown in FIG. 15. In a number of embodiments, shift circuitry 1523 such as that shown in FIG. 15 can be operated (e.g., in conjunction with sense amplifiers 1506 and compute components 1531) in association with performing compute functions such as adding and subtracting functions without transferring data out of the sensing circuitry 1550 via an I/O line (e.g., local I/O line (IO/IO_)), for instance.

Although not shown in FIG. 15, each column of memory cells can be coupled to a column decode line that can be enabled to transfer, via local I/O line, a data value from a corresponding sense amplifier 1506 and/or compute component 1531 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 1523 can be operated in conjunction with sense amplifiers 1506 and compute components 1531 to perform compute functions such as adding and subtracting functions without transferring data to a control component external to the array, for instance.

The sensing circuitry 1550 can be operated in several modes to perform logical operations, including a first mode in which a result of the logical operation is initially stored in the compute component 1531, and a second mode in which a result of the logical operation is initially stored in the sense amplifier 1506. Operation of the sensing circuitry 1550 in the first mode is similar to the operations described for the sensing circuitry 850-3 shown in FIG. 8 and the timing diagrams shown in FIGS. 9-12 (the difference being that the additional dynamic latch of the compute component 1531 operates together with the state static latch 1564 of the compute component 1531). Operation of the sensing circuitry 1550 in the second mode is described below with respect to FIGS. 17 and 18. Additionally with respect to the second operating mode, sensing circuitry 1550 can be operated in both pre-sensing (e.g., sense amps fired before logical operation control signal active) and post-sensing (e.g., sense amps fired after logical operation control signal active) modes with a result of a logical operation being initially stored in the sense amplifier 1506.

As described further below, the sense amplifier 1506 can, in conjunction with the compute component 1531, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The functionality of the sensing circuitry 1550 of FIG. 15 is described below and summarized in Table 2 below with respect to performing logical operations and initially storing a result in the sense amplifier 1506. Initially storing the result of a particular logical operation in the primary latch of sense amplifier 1506 can provide improved versatility as compared to previous approaches in which the result may initially reside in a secondary latch (e.g., serving as an accumulator) of a compute component 1531, and then be subsequently transferred to the sense amplifier 1506, for instance.

TABLE 2

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 1506 (e.g., without having to perform an additional operation to move the result from the compute component 1531 (e.g., serving as an accumulator) to the sense amplifier 1506) is advantageous because, for instance, the result can be written to a row (of the array of memory cells) or back into the accumulator without performing a precharge cycle (e.g., on the complementary data lines 1505-1 (D) and/or 1505-2 (D_)).

Figure 17:
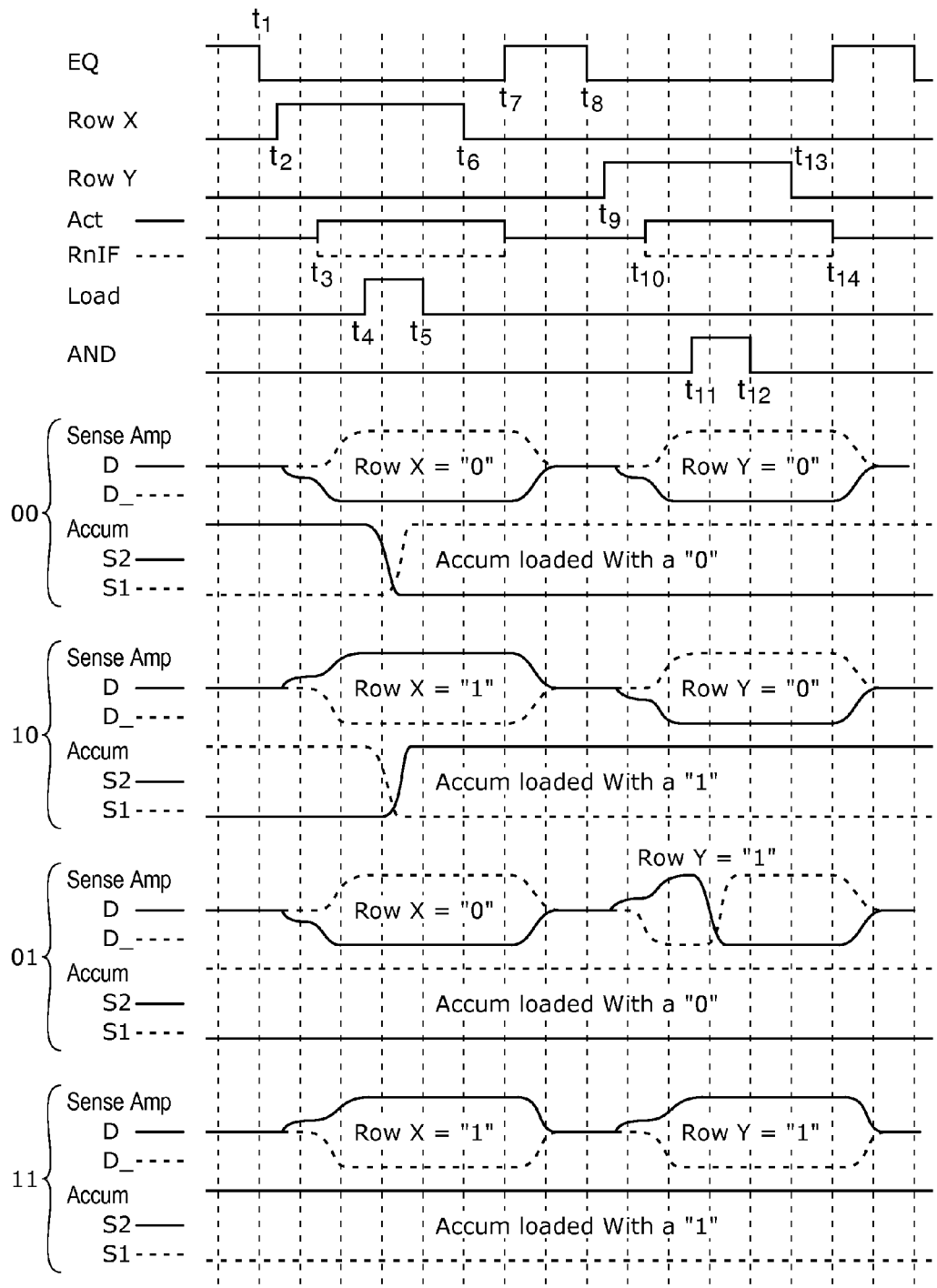
FIG. 17 illustrates a timing diagram associated with performing a number of logical operations using sensing circuitry in accordance with a number of embodiments of the present disclosure.

FIG. 17 illustrates a timing diagram associated with performing a number of logical operations using sensing circuitry in accordance with a number of embodiments of the present disclosure.

The sensing circuitry 1350 can be operated in several modes to perform logical operations, including a first mode in which a result of the logical operation is initially stored in the sense amplifier 1306, and a second mode in which a result of the logical operation is initially stored in the compute component 1331. Operation of the sensing circuitry 1350 in the first mode is described below with respect to FIGS. 3 and 4, and operation of the sensing circuitry 1350 in the second mode is described below with respect to FIGS. 14-17. Additionally with respect to the first operating mode, sensing circuitry 1350 can be operated in both pre-sensing (e.g., sense amps fired before logical operation control signal active) and post-sensing (e.g., sense amps fired after logical operation control signal active) modes with a result of a logical operation being initially stored in the sense amplifier 1306.

As described further below, the sense amplifier 1306 can, in conjunction with the compute component 1331, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

FIG. 17 illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 17 illustrates a number of control signals associated with operating sensing circuitry (e.g., 1550) to perform the AND logical operation. "EQ" corresponds to an equilibrate signal applied to the sense amplifier 1506, "ROW X" corresponds to an enabling signal applied to access line 1504-X, "ROW Y" corresponds to an enabling signal applied to access line 1504-Y, "Act" and "RnIF" correspond to a respective active positive and negative control signal applied to the sense amplifier 1506, "LOAD" corresponds to a load control signal (e.g., LOAD/PASSD and LOAD/PASSDb shown in FIG. 15), and "AND" corresponds to the AND control signal shown in FIG. 15. FIG. 17 also illustrates the waveform diagrams showing the signals (e.g., voltage signals) on the digit lines D and D_ corresponding to sense amplifier 1506 and on the nodes S1 and S2 corresponding to the compute component 1531 (e.g., serving as an accumulator) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 15.

An example of pseudo code associated with loading (e.g., copying) a first data value stored in a cell coupled to row 1504-X into the accumulator can be summarized as follows:

Copy Row X into the Accumulator:
   Deactivate EQ
   Open Row X
   Fire Sense Amps (after which Row X data resides in the sense amps)
   Activate LOAD (sense amplifier data (Row X) is transferred to nodes
      S1 and S2 of the Accumulator and resides there dynamically)
   Deactivate LOAD
   Close Row X
   Precharge In the pseudo code above, "Deactivate EQ" indicates that an equilibration signal (EQ signal shown in FIG. 17) corresponding to the sense amplifier 1506 is disabled at $t_1$ as shown in FIG. 17 (e.g., such that the complementary data lines (e.g., 1505-1 (D) and 1505-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 17. When the voltage signal applied to ROW X reaches the threshold voltage (Vt) of the access transistor (e.g., 1502-2) corresponding to the selected cell, the access transistor turns on and couples the data line (e.g., 1505-2 (D_)) to the selected cell (e.g., to capacitor 1503-2) which creates a differential voltage signal between the data lines.

After Row X is enabled in the pseudo code above, "Fire Sense Amps" indicates that the sense amplifier 1506 is enabled to set the primary latch and subsequently disabled. For example, as shown at $t_3$ in FIG. 17, the ACT positive control signal (e.g., 1690 shown in FIG. 16) goes high and the RnIF negative control signal (e.g., 1628 shown in FIG. 16) goes low, which amplifies the differential signal between 1505-1 (D) and D_ 1505-2, resulting in a voltage (e.g., $V_{DD}$) corresponding to a logic 1 or a voltage (e.g., GND) corresponding to a logic 0 being on data line 1505-1 (D) (and the voltage corresponding to the other logic state being on complementary data line 1505-2 (D_)). The sensed data value is stored in the primary latch of sense amplifier 1506. The primary energy consumption occurs in charging the data lines (e.g., 1505-1 (D) or 1505-2 (D_)) from the equilibration voltage $V_{DD}/2$ to the rail voltage $V_{DD}$.

The four sets of possible sense amplifier and accumulator signals illustrated in FIG. 17 (e.g., one for each combination of Row X and Row Y data values) shows the behavior of signals on data lines D and D_. The Row X data value is stored in the primary latch of the sense amp. It should be noted that FIG. 15 shows that the memory cell including storage element 1502-2, corresponding to Row X, is coupled to the complementary data line D_, while the memory cell including storage element 1502-1, corresponding to Row Y, is coupled to data line D. However, as can be seen in FIG. 15, the charge stored in memory cell 1502-2 (corresponding to Row X) corresponding to a "0" data value causes the voltage on data line D_ (to which memory cell 1502-2 is coupled) to go high and the charge stored in memory cell 1502-2 corresponding to a "1" data value causes the voltage on data line D_ to go low, which is opposite correspondence between data states and charge stored in memory cell 1502-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 17, causing load/pass transistors 1518-1 and 1518-2 to conduct. In this manner, activating the LOAD control signal enables the secondary latch in the accumulator of the compute component 1531. The sensed data value stored in the sense amplifier 1506 is transferred (e.g., copied) to the secondary latch. As shown for each of the four sets of possible sense amplifier and accumulator signals illustrated in FIG. 17, the behavior at inputs of the secondary latch of the accumulator indicates the secondary latch is loaded with the Row X data value. As shown in FIG. 17, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 1505-1 (D) and 1505-2 (D_), in the pseudo code above, "Deactivate LOAD" indicates that the LOAD control signal goes back low as shown at is in FIG. 17 to cause the load/pass transistors 1518-1 and 1518-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 17, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 17 by the EQ signal going high at $t_7$. As shown in each of the four sets of possible sense amplifier and accumulator signals illustrated in FIG. 17 at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 1506 and the secondary latch of the compute component 1531) and the second data value (stored in a memory cell 1502-1 coupled to Row Y 1504-Y) includes performing particular steps which depend on the whether an AND or an OR is to be performed. Examples of pseudo code associated with "ANDing" and "ORing" the data value residing in the accumulator (e.g., the first data value stored in the memory cell 1502-2 coupled to Row X 1504-X) and the second data value (e.g., the data value stored in the memory cell 1502-1 coupled to Row Y 1504-Y) are summarized below. Example pseudo code associated with "ANDing" the data values can include:

Deactivate EQ
Open Row Y
Fire Sense Amps (after which Row Y data resides in the sense amps)
Close Row Y
    The result of the logic operation, in the next operation, will be placed on the sense amp, which will overwrite any row that is active.
    Even when Row Y is closed, the sense amplifier still contains the Row Y data value.
Activate AND
    This results in the sense amplifier being written to the value of the function (e.g., Row X AND Row Y)
    If the accumulator contains a "0" (i.e., a voltage corresponding to a "0" on node S2 and a voltage corresponding to a "1" on node S1),
        the sense amplifier data is written to a "0"
    If the accumulator contains a "1" (i.e., a voltage corresponding to a "1" on node S2 and a voltage corresponding to a "0" on node S1),
        the sense amplifier data remains unchanged (Row Y data)
    This operation leaves the data in the accumulator unchanged.
Deactivate AND
Precharge In the pseudo code above, "Deactivate EQ" indicates that an equilibration signal corresponding to the sense amplifier 1506 is disabled (e.g., such that the complementary data lines 1505-1 (D) and 1505-2 (D_) are no longer shorted to $V_{DD}/2$), which is illustrated in FIG. 17 at $t_8$. After equilibration is disabled, a selected row (e.g., ROW Y) is enabled as indicated in the pseudo code above by "Open Row Y" and shown in FIG. 17 at $t_9$. When the voltage signal applied to ROW Y reaches the threshold voltage (Vt) of the access transistor (e.g., 1502-1) corresponding to the selected cell, the access transistor turns on and couples the data line (e.g., D_ 1505-1) to the selected cell (e.g., to capacitor 1503-1) which creates a differential voltage signal between the data lines.

After Row Y is enabled, in the pseudo code above, "Fire Sense Amps" indicates that the sense amplifier 1506 is enabled to amplify the differential signal between 1505-1 (D) and 1505-2 (D_), resulting in a voltage (e.g., $V_{DD}$) corresponding to a logic 1 or a voltage (e.g., GND) corresponding to a logic 0 being on data line 1505-1 (D) (and the voltage corresponding to the other logic state being on complementary data line 1505-2 (D_)). As shown at $t_{10}$ in FIG. 17, the ACT positive control signal (e.g., 1690 shown in FIG. 16) goes high and the RnIF negative control signal (e.g., 1628 shown in FIG. 16) goes low to fire the sense amps. The sensed data value from memory cell 1502-1 is stored in the primary latch of sense amplifier 1506, as previously described. The secondary latch still corresponds to the data value from memory cell 1502-2 since the dynamic latch is unchanged.

After the second data value sensed from the memory cell 1502-1 coupled to Row Y is stored in the primary latch of sense amplifier 1506, in the pseudo code above, "Close Row Y" indicates that the selected row (e.g., ROW Y) can be disabled if it is not desired to store the result of the AND logical operation back in the memory cell corresponding to Row Y. However, FIG. 17 shows that Row Y is left enabled such that the result of the logical operation can be stored back in the memory cell corresponding to Row Y. Isolating the memory cell corresponding to Row Y can be accomplished by the access transistor turning off to decouple the selected cell 1502-1 from the data line 1505-1 (D). After the selected Row Y is configured (e.g., to isolate the memory cell or not isolate the memory cell), "Activate AND" in the pseudo code above indicates that the AND control signal goes high as shown in FIG. 17 at $t_{11}$, causing pass transistor 1507-1 to conduct. In this manner, activating the AND control signal causes the value of the function (e.g., Row X AND Row Y) to be written to the sense amp.

With the first data value (e.g., Row X) stored in the dynamic latch of the accumulator 1531 and the second data value (e.g., Row Y) stored in the sense amplifier 1506, if the dynamic latch of the compute component 1531 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 1509-1 to conduct thereby coupling the sense amplifier 1506 to ground through transistor 1509-1, pass transistor 1507-1 and data line 1505-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 1506. This operation leaves the data value in the accumulator unchanged (e.g., from Row X).

If the secondary latch of the accumulator contains a "1" (e.g., from Row X), then the result of the AND operation depends on the data value stored in the sense amplifier 1506 (e.g., from Row Y). The result of the AND operation should be a "1" if the data value stored in the sense amplifier 1506 (e.g., from Row Y) is also a "1," but the result of the AND operation should be a "0" if the data value stored in the sense amplifier 1506 (e.g., from Row Y) is also a "0." The sensing circuitry 1550 is configured such that if the dynamic latch of the accumulator contains a "1" (i.e., a voltage corresponding to a "1" on node S2 and a voltage corresponding to a "0" on node S1), transistor 1509-1 does not conduct, the sense amplifier is not coupled to ground (as described above), and the data value previously stored in the sense amplifier 1506 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 1506, "Deactivate AND" in the pseudo code above indicates that the AND control signal goes low as shown at $t_{12}$ in FIG. 17, causing pass transistor 1507-1 to stop conducting to isolate the sense amplifier 1506 (and data line 1505-1 (D)) from ground. If not previously done, Row Y can be closed (as shown at $t_{13}$ in FIG. 17) and the sense amplifier can be disabled (as shown at $t_{14}$ in FIG. 17 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 17).

FIG. 17 shows, in the alternative, the behavior of voltage signals on the data lines (e.g., 1505-1 (D) and 1505-2 (D_) shown in FIG. 15) coupled to the sense amplifier (e.g., 1506 shown in FIG. 15) and the behavior of voltage signals on nodes S1 and S1 of the secondary latch of the compute component (e.g., 1531 shown in FIG. 15) for an AND logical operation involving each of the possible combination of operands (e.g., Row X/Row Y data values 00, 10, 01, and 11).

Although the timing diagrams illustrated in FIG. 17 and the pseudo code described above indicate initiating the AND logical operation after starting to load the second operand (e.g., Row Y data value) into the sense amplifier, the circuit shown in FIG. 15 can be successfully operated by initiating the AND logical operation before starting to load the second operand (e.g., Row Y data value) into the sense amplifier.

Figure 18:
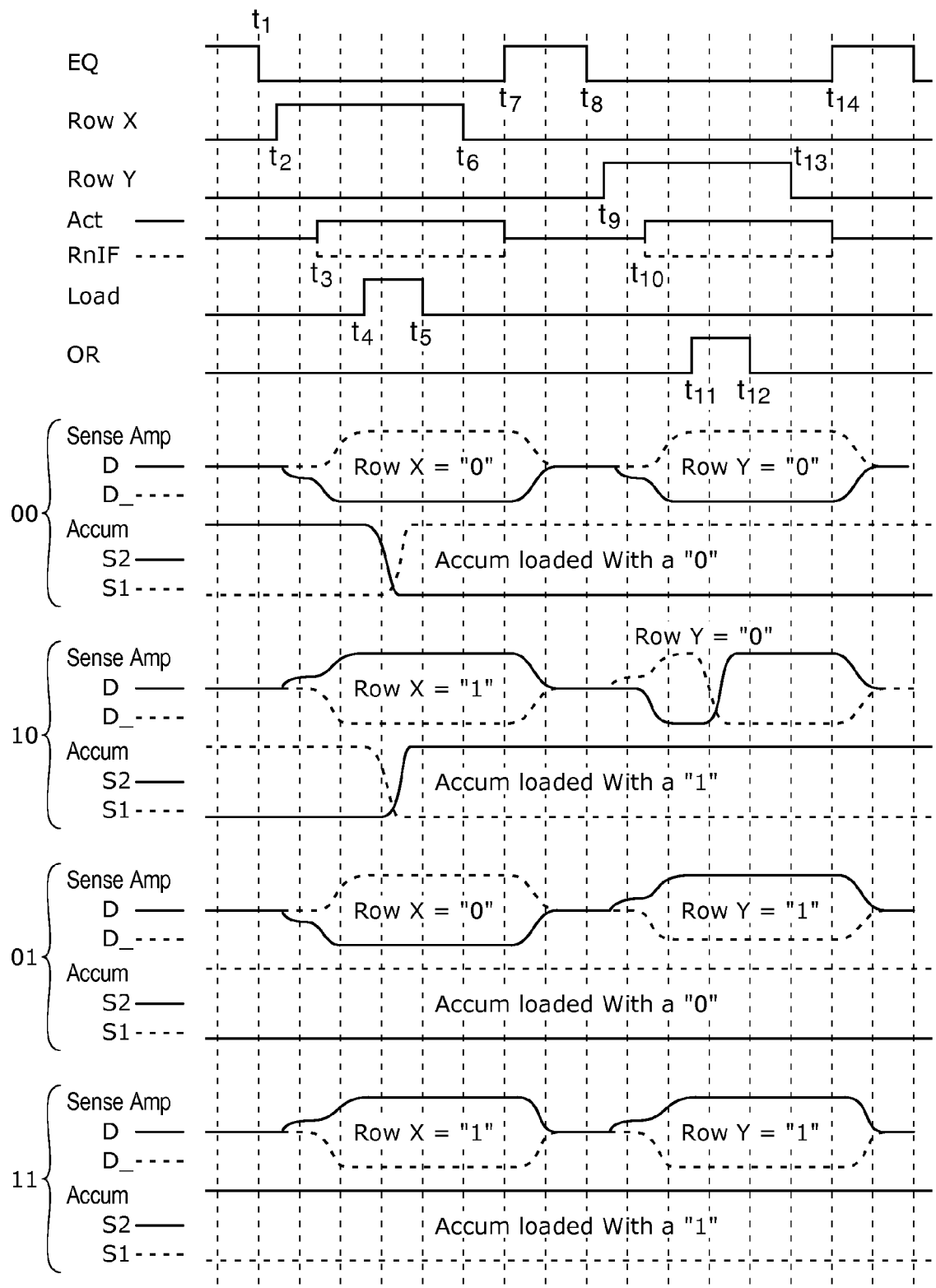
FIG. 18 illustrates a timing diagram associated with performing a number of logical operations using sensing circuitry in accordance with a number of embodiments of the present disclosure.

FIG. 18 illustrates a timing diagram associated with performing a number of logical operations using sensing circuitry in accordance with a number of embodiments of the present disclosure. FIG. 18 illustrates a timing diagram associated with initiating an OR logical operation after starting to load the second operand (e.g., Row Y data value) into the sense amplifier. FIG. 18 illustrates the sense amplifier and accumulator signals for various combinations of first and second operand data values. The particular timing diagram signals are discussed below with respect to the pseudo code associated with an AND logical operation of the circuit shown in FIG. 15.

A subsequent operation phase can alternately be associated with performing the OR operation on the first data value (now stored in the sense amplifier 1506 and the secondary latch of the compute component 1531) and the second data value (stored in a memory cell 1502-1 coupled to Row Y 1504-Y). The operations to load the Row X data into the sense amplifier and accumulator that were previously described with respect to times $t_1$-$t_7$ shown in FIG. 17 are not repeated with respect to FIG. 18. Example pseudo code associated with "ORing" the data values can include:

---

Deactivate EQ
Open Row Y
Fire Sense Amps (after which Row Y data resides in the sense amps)
Close Row Y
    When Row Y is closed, the sense amplifier still contains the Row Y data value.
Activate OR
    This results in the sense amplifier being written to the value of the function (e.g., Row X OR Row Y), which may overwrite the data
    value from Row Y previously stored in the sense amplifier as follows:
    If the accumulator contains a "0" (i.e., a voltage corresponding to a "0" on node S2 and a voltage corresponding to a "1" on node S1),
        the sense amplifier data remains unchanged (Row Y data)
    If the accumulator contains a "1" (i.e., a voltage corresponding to a "1" on node S2 and a voltage corresponding to a "0" on node S1),
        the sense amplifier data is written to a "1"
    This operation leaves the data in the accumulator unchanged.
Deactivate OR
Precharge

---

The "Deactivate EQ" (shown at is in FIG. 18), "Open Row Y" (shown at $t_9$ in FIG. 18), "Fire Sense Amps" (shown at $t_{10}$ in FIG. 18), and "Close Row Y" (shown at $t_{13}$ in FIG. 18, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 18, which causes pass transistor 1507-2 to conduct. In this manner, activating the OR control signal causes the value of the function (e.g., Row X OR Row Y) to be written to the sense amp.

With the first data value (e.g., Row X) stored in the secondary latch of the compute component 1531 and the second data value (e.g., Row Y) stored in the sense amplifier 1506, if the dynamic latch of the accumulator contains a "0" (i.e., a voltage corresponding to a "0" on node S2 and a voltage corresponding to a "1" on node S1), then the result of the OR operation depends on the data value stored in the sense amplifier 1506 (e.g., from Row Y). The result of the OR operation should be a "1" if the data value stored in the sense amplifier 1506 (e.g., from Row Y) is a "1," but the result of the OR operation should be a "0" if the data value stored in the sense amplifier 1506 (e.g., from Row Y) is also a "0." The sensing circuitry 1550 is configured such that if the dynamic latch of the accumulator contains a "0," with the voltage corresponding to a "0" on node S2, transistor 1509-2 is off and does not conduct (and pass transistor 1507-1 is also off since the AND control signal is not asserted) so the sense amplifier 1506 is not coupled to ground (either side), and the data value previously stored in the sense amplifier 1506 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 1509-2 does conduct (as does pass transistor 1507-2 since the OR control signal is asserted), and the sense amplifier 1506 input coupled to data line 1505-2 (D_) is coupled to ground since the voltage corresponding to a "1" on node S2 causes transistor 1509-2 to conduct along with pass transistor 1507-2 (which also conducts since the OR control signal is asserted). In this manner, a "1" is initially stored in the sense amplifier 1506 as a result of the OR operation when the secondary latch of the accumulator contains a "1" regardless of the data value previously stored in the sense amp. This operation leaves the data in the accumulator unchanged. FIG. 18 shows, in the alternative, the behavior of voltage signals on the data lines (e.g., 1505-1 (D) and 1505-2 (D_) shown in FIG. 15) coupled to the sense amplifier (e.g., 1506 shown in FIG. 15) and the behavior of voltage signals on nodes S1 and S2 of the secondary latch of the compute component 1531 for an OR logical operation involving each of the possible combination of operands (e.g., Row X/Row Y data values 00, 10, 01, and 11).

After the result of the OR operation is initially stored in the sense amplifier 1506, "Deactivate OR" in the pseudo code above indicates that the OR control signal goes low as shown at $t_{12}$ in FIG. 18, causing pass transistor 1507-2 to stop conducting to isolate the sense amplifier 1506 (and data line D 1505-2) from ground. If not previously done, Row Y can be closed (as shown at $t_{13}$ in FIG. 18) and the sense amplifier can be disabled (as shown at $t_{14}$ in FIG. 18 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 18.

The sensing circuitry 1550 illustrated in FIG. 15 can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 1514-1 to conduct and activating the ANDinv control signal causes transistor 1514-2 to conduct. In each case, asserting the appropriate inverted control signal can flip the sense amplifier and cause the result initially stored in the sense amplifier 1506 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 15 can perform a NOT (e.g., invert) operation by putting the non-inverted data value into the dynamic latch of the accumulator and using that data to invert the data value in the sense amplifier 1506. As previously mentioned, activating the ORinv control signal causes transistor 1514-1 to conduct and activating the ANDinv control signal causes transistor 1514-2 to conduct. The ORinv and/or ANDinv control signals are used in implementing the NOT function, as described further below:

---

Copy Row X into the Accumulator
    Deactivate EQ
    Open Row X
    Fire Sense Amps (after which Row X data resides in the sense amps)
    Activate LOAD (sense amplifier data (Row X) is transferred to nodes
        S1 and S2 of the Accumulator and resides there dynamically
    Deactivate LOAD
    Activate ANDinv and ORinv (which puts the compliment data value
        on the data lines)
        This results in the data value in the sense amplifier being
            inverted
            (e.g., the sense amplifier latch is flipped)
        This operation leaves the data in the accumulator unchanged
    Deactivate ANDinv and ORinv
    Close Row X
    Precharge

---

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and precharging after the Row X data is loaded into the sense amplifier 1506 and copied into the dynamic latch, a compliment version of the data value in the dynamic latch of the accumulator can be placed on the data line and thus transferred to the sense amplifier 1506 by enabling (e.g., causing transistor to conduct) and disabling the invert transistors (e.g., ANDinv and ORinv). This results in the sense amplifier 1506 being flipped from the true data value that was previously stored in the sense amplifier to a compliment data value (e.g., inverted data value) stored in the sense amp. That is, a true or compliment version of the data value in the accumulator can be transferred to the sense amplifier by activating and deactivating ANDinv and ORinv. This operation leaves the data in the accumulator unchanged.

Because the sensing circuitry 1550 shown in FIG. 15 initially stores the result of the AND, OR, and NOT logical operations in the sense amplifier 1506 (e.g., on the sense amplifier nodes), these logical operation results can be communicated easily and quickly to any enabled row and/or into the secondary latch of the compute component 1531. The sense amplifier 1506 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 1506 fires.

When performing logical operations in this manner, the sense amplifier 1506 can be pre-seeded with a data value from the dynamic latch of the accumulator to reduce overall current utilized because the sense amps 1506 are not at full rail voltages (e.g., supply voltage or ground/reference voltage) when accumulator function is copied to the sense amplifier 1506. An operation sequence with a pre-seeded sense amplifier 1506 either forces one of the data lines to the reference voltage (leaving the complementary data line at $V_{DD}/2$, or leaves the complementary data lines unchanged. The sense amplifier 1506 pulls the respective data lines to full rails when the sense amplifier 1506 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 1523 can be used for shifting data values stored in memory cells coupled to a particular pair of complementary data lines to the sensing circuitry 1550 (e.g., sense amplifier 1506) corresponding to a different pair of complementary data lines (e.g., such as a sense amplifier 1506 corresponding to a left or right adjacent pair of complementary data lines. As used herein, a sense amplifier 1506 corresponds to the pair of complementary data lines to which the sense amplifier is coupled when isolation transistors 1521-1 and 1521-2 are conducting. The SHIFT operations (right or left) do not pre-copy the Row X data value into the accumulator. Operations to shift right Row X can be summarized as follows:

---

Deactivate Norm and Activate Shift
Deactivate EQ
Open Row X
Fire Sense Amps (after which shifted Row X data resides in the sense amps)
Activate Norm and Deactivate Shift
Close Row X
Precharge

---

In the pseudo code above, "Deactivate Norm and Activate Shift" indicates that a NORM control signal goes low causing isolation transistors 1521-1 and 1521-2 of the shift circuitry 1523 to not conduct (e.g., isolate the sense amplifier from the corresponding pair of complementary data lines). The SHIFT control signal goes high causing isolation transistors 1521-3 and 1521-4 to conduct, thereby coupling the sense amplifier 1506 to the left adjacent pair of complementary data lines (e.g., on the memory array side of non-conducting isolation transistors 1521-1 and 1521-2 for the left adjacent pair of complementary data lines).

After the shift circuitry 1523 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 1506.

In the pseudo code above, "Activate Norm and Deactivate Shift" indicates that a NORM control signal goes high causing isolation transistors 1521-1 and 1521-2 of the shift circuitry 1523 to conduct (e.g., coupling the sense amplifier to the corresponding pair of complementary data lines), and the SHIFT control signal goes low causing isolation transistors 1521-3 and 1521-4 to not conduct and isolating the sense amplifier 1506 from the left adjacent pair of complementary data lines (e.g., on the memory array side of non-conducting isolation transistors 1521-1 and 1521-2 for the left adjacent pair of complementary data lines). Since Row X is still active, the Row X data value that has been shifted right is transferred to Row X of the corresponding pair of complementary data lines through isolation transistors 1521-1 and 1521-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

---

Activate Norm and Deactivate Shift
Deactivate EQ
Open Row X
Fire Sense Amps (after which Row X data resides in the sense amps)
Deactivate Norm and Activate Shift
    Sense amplifier data (shifted left Row X) is transferred to Row X
Close Row X
Precharge

---

In the pseudo code above, "Activate Norm and Deactivate Shift" indicates that a NORM control signal goes high causing isolation transistors 1521-1 and 1521-2 of the shift circuitry 1523 to conduct, and the SHIFT control signal goes low causing isolation transistors 1521-3 and 1521-4 to not conduct. This configuration couples the sense amplifier 1506 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 1550 is stored in the sense amplifier 1506.

In the pseudo code above, "Deactivate Norm and Activate Shift" indicates that a NORM control signal goes low causing isolation transistors 1521-1 and 1521-2 of the shift circuitry 1523 to not conduct (e.g., isolate the sense amplifier from the corresponding pair of complementary data lines), and the SHIFT control signal goes high causing isolation transistors 1521-3 and 1521-4 to conduct coupling the sense amplifier to the left adjacent pair of complementary data lines (e.g., on the memory array side of non-conducting isolation transistors 1521-1 and 1521-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDs or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells; and
   sensing circuitry coupled to the array of memory cells via a sense line, wherein the sensing circuitry comprises a sense amplifier coupled to equilibrate circuitry, and wherein a controller controls the sensing circuitry to:
   sense, as a voltage associated with a second operand of a logical function stored in a second memory cell, a voltage on the sense line corresponding to a first logical data value resulting in part from reading a first memory cell of the array of memory cells storing a first operand of the logical function, and
   prior to sensing the voltage associated with the second operand, precharge the sense line responsive to the logical function being a first logical function, and not precharge the sense line responsive to the logical function being a second logical function.

2. The apparatus of claim 1, wherein the sensing circuitry is configured to sense, as the voltage associated with the second operand of an AND logical function, the voltage on the sense line corresponding to a first "0" logical data value resulting in part from reading the first memory cell of the array of memory cells associated with the first operand of the AND logical function.

3. The apparatus of claim 2, wherein the sensing circuitry is further configured to not precharge the sense line after the voltage corresponding to a "0" logical data value is on the sense line after reading the first memory cell during the AND logical function.

4. The apparatus of claim 2, wherein the sensing circuitry is further configured to precharge the sense line after reading the first memory cell storing a charge corresponding to a "1" logical data value before reading a second memory cell associated with a second operand of the AND logical function.

5. The apparatus of claim 2, wherein the sensing circuitry is further configured to not precharge the sense line after reading the first memory cell and before reading a second memory cell associated with a second operand of the AND logical function when a voltage on the sense line is less than a precharge voltage level after reading the first memory cell and before reading the second memory cell.

6. The apparatus of claim 2, wherein the sensing circuitry is further configured to retain the voltage on the sense line corresponding to the "0" logical data value until reading a second memory cell associated with a second operand of the AND logical function.

7. The apparatus of claim 2, wherein the sensing circuitry is configured to sense the voltage associated with the second operand of the AND logical function on the sense line as corresponding to a second "0" logical data value resulting from a sense line precharge voltage modified by a charge stored in the first memory cell and further modified by a second charge stored in a second memory cell,
   wherein the second charge stored in the second memory cell corresponds to a "1" logical data value.

8. The apparatus of claim 2, wherein the sensing circuitry is further configured to precharge the sense line after the voltage corresponding to a "1" logical data value is on the sense line after reading the first memory cell.

9. The apparatus of claim 2, wherein the sensing circuitry is further configured to precharge the sense line after reading the first memory cell and before reading a second memory cell associated with a second operand of the AND logical function when a voltage on the sense line is greater than a precharge voltage level after reading the first memory cell and before reading the second memory cell.

10. The apparatus of claim 2, wherein the sensing circuitry is configured to sense, as a voltage associated with a second operand of an AND logical function, a voltage on the sense line corresponding to a logical data value that does not result in part from reading a first memory cell of the array of memory cells associated with a first operand of an AND logical function.

11. The apparatus of claim 2, wherein the sensing circuitry is configured to sense, as a voltage associated with a second operand of an AND logical function, a voltage on the sense line corresponding to a logical data value resulting from a sense line precharge voltage modified by a charge stored in a second memory cell.

12. The apparatus of claim 2, wherein the sensing circuitry is configured to sense, as a voltage associated with a second operand of an OR logical function, a voltage on the sense line corresponding to a first "1" logical data value resulting in part from reading a first memory cell of the array of memory cells associated with a first operand of the OR logical function.

13. The apparatus of claim 1, wherein the sensing circuitry is configured to sense, as the voltage associated with the second operand of an OR logical function, the voltage on the sense line corresponding to a first "1" logical data value resulting in part from reading the first memory cell of the array of memory cells associated with the first operand of the OR logical function.

14. The apparatus of claim 13, wherein the sensing circuitry is further configured to not precharge the sense line after the voltage corresponding to a "1" logical data value is on the sense line after reading the first memory cell during the OR logical function.

15. The apparatus of claim 13, wherein the sensing circuitry is further configured to precharge the sense line after reading the first memory cell storing a charge corresponding to a "0" logical data value before reading a second memory cell associated with the second operand of the OR logical function.

16. The apparatus of claim 13, wherein the sensing circuitry is configured to sense the voltage associated with the second operand of the OR logical function on the sense line as corresponding to a second "1" logical data value resulting from a sense line precharge voltage modified by a charge stored in the first memory cell and further modified by a second charge stored in a second memory cell, wherein the second charge stored in the second memory cell corresponds to a "0" logical data value.

17. An apparatus, comprising:
an array of memory cells; and
sensing circuitry coupled to the array of memory cells via a sense line, and a controller configured to control the sensing circuitry to perform a logical function between a data value stored in a first memory cell and a data value stored in a second memory cell, the sensing circuitry including:
a sense amplifier coupled to the sense line; and
equilibrate circuitry coupled to the sense amplifier,
wherein the controller controls the equilibrate circuitry to, subsequently to reading the first memory cell:
precharge the sense line prior to reading the second memory cell in response to the logical function being a first logical function; and
not precharge the sense line prior to reading the second memory cell in response to the logical function being a second logical function.

18. The apparatus of claim 17, wherein the equilibrate circuitry is further configured to:
not precharge the sense line prior to reading the second memory cell when a voltage corresponding to a "0" logical data value is on the sense line after reading the first memory cell during an AND logical function; and
not precharge the sense line prior to reading the second memory cell when a voltage corresponding to a "1" logical data value is on the sense line after reading the first memory cell during an OR logical function.

19. The apparatus of claim 17, wherein the equilibrate circuitry is further configured to:
precharge the sense line prior to reading the second memory cell when a voltage corresponding to a "1" logical data value is on the sense line after reading the first memory cell during an AND logical function; and
precharge the sense line prior to reading the second memory cell when a voltage corresponding to a "0" logical data value is on the sense line after reading the first memory cell during an OR logical function.

20. The apparatus of claim 17, wherein transistors comprising the equilibrate circuitry are on pitch with transistors comprising the array of memory cells.

21. The apparatus of claim 17, wherein the equilibrate circuitry is configured to cause a result of the logical function to be initially stored in the sense amplifier.

22. The apparatus of claim 21, wherein the sensing circuitry comprises a single latch used to perform the logical function.

23. The apparatus of claim 17, wherein the sensing circuitry is configured to selectively isolate the sense amplifier from the sense line.

24. The apparatus of claim 17, wherein the sensing circuitry is further configured to consume less power when switching a bit on an AND or OR logical function than when sensing the first or second memory cell.

25. An apparatus, comprising:
an array of memory cells; and
sensing circuitry coupled to the array of memory cells via a pair of complementary sense lines, the sensing circuitry including:
a sense amplifier coupled to the pair of complementary sense lines and configured to store a data value read from a first memory cell as a first input of a logical function; and
equilibrate circuitry coupled to the sense amplifier, the equilibrate circuitry including transistors configured to cause voltages corresponding to a result of an AND logical function and an OR logical function between the data value read from the first memory cell and a data value stored in a second memory cell to occur on the pair of complementary sense lines;
wherein the data value stored in the second memory cell is a second input of the logical operation, and wherein the result of the logical function between the data value read from first memory cell and the data value stored in the second memory cell is stored in the sense amplifier.

26. The apparatus of claim 25, wherein the equilibrate circuitry comprises:
a first transistor;
a second transistor; and
a third transistor,
wherein:
a first source/drain region of the first transistor is coupled to a first source/drain region of the second transistor and a first one of the pair of complementary sense lines;
a first source/drain region of the third transistor is coupled to a second source/drain region of the second transistor and a second one of the pair of complementary sense lines;
a second source/drain region of the first transistor and a second source/drain region of the second transistor are coupled to a precharge voltage supply; and
a gate of the first transistor is coupled to a gate of the second transistor.

27. The apparatus of claim 26, wherein the precharge voltage supply is configured to provide a voltage equal to VCC/2, wherein VCC is a supply voltage associated with the array of memory cells.

28. The apparatus of claim 26, wherein the equilibrate circuitry further comprises:
a first source/drain region of a fourth transistor coupled to a first source/drain region of a fifth transistor;
a first source/drain region of a sixth transistor coupled to a first source/drain region of a seventh transistor;
a second source/drain region of the fourth transistor and a second source/drain region of the sixth transistor are coupled to the supply voltage associated with the array of memory cells;
a second source/drain region of the fifth transistor and a second source/drain region of the seventh transistor are coupled to the gate of the first transistor and the gate of the third transistor;
a gate of the fifth transistor is coupled to the first one of the pair of complementary sense lines; and
a gate of the seventh transistor is coupled to the second one of the pair of complementary sense lines.

29. The apparatus of claim 28, wherein:
a gate of the fourth transistor is coupled to an OR logical function control signal line; and
a gate of the sixth transistor is coupled to an AND logical function control signal line.

30. The apparatus of claim 29, wherein:
the first, second, and third transistors are n-channel transistors; and
the fourth, fifth, sixth, and seventh transistors are p-channel transistors.

31. The apparatus of claim 28, wherein the equilibrate circuitry further comprises a first source/drain region of an eighth transistor coupled to a ground reference, a second source/drain region of the eighth transistor coupled to the gate of the first transistor and the gate of the third transistor, and a gate of the eighth transistor is coupled to an equilibration control signal line.

32. The apparatus of claim 26, wherein the equilibrate circuitry further comprises:
a first source/drain region of a fourth transistor is coupled to an OR logical function control signal line;
a first source/drain region of a fifth transistor is coupled to an AND logical function control signal line;
a second source/drain region of the fourth transistor and a second source/drain region of the fifth transistor are coupled to the gate of the first transistor and the gate of the third transistor;
a gate of the fourth transistor is switchably coupled to the first one of the pair of complementary sense lines; and
a gate of the fifth transistor is switchably coupled to the second one of the pair of complementary sense lines.

33. The apparatus of claim 32, wherein the equilibrate circuitry further comprises a first source/drain region of a sixth transistor coupled to a ground reference, a second source/drain region of the sixth transistor coupled to the gate of the first transistor and the gate of the third transistor, and a gate of the eighth transistor is coupled to an equilibration control signal line.

34. The apparatus of claim 33, further comprising inverting circuitry configured to selectively couple at most one of the pair of complementary sense lines to a ground reference.

35. The apparatus of claim 34, wherein the inverting circuitry includes:
a first source/drain region of a first invert transistor coupled to a first source/drain region of a first pulldown transistor;
a first source/drain region of a second invert transistor coupled to a first source/drain region of a second pulldown transistor;
a first source/drain region of a first load transistor coupled to a second source/drain region of the first invert transistor and a first one of the pair of complementary sense lines;
a second source/drain region of the first load transistor coupled to a gate of the first pulldown transistor;
a first source/drain region of a second load transistor coupled to a second source/drain region of the second invert transistor and a second one of the pair of complementary sense lines;
a second source/drain region of the second load transistor coupled to a gate of the second pulldown transistor;
a gate of the first load transistor coupled to a gate of the second load transistor and a LOAD control signal line;
a second source/drain region of the first pulldown transistor and a second source/drain region of the second pulldown transistor coupled to a ground reference; and
a gate of the first invert transistor and a gate of the second invert transistor coupled to an INVERT control signal line.

36. The apparatus of claim 35, further comprising a cross-coupled latch coupled between the second source/drain region of the first load transistor and the second source/drain region of the second load transistor, wherein the gate of the fourth transistor is coupled to a first node of the cross-coupled latch and the gate of the fifth transistor is coupled to a second node of the cross-coupled latch.

37. The apparatus of claim 25, wherein the sense amplifier includes a cross-coupled latch configured to initially store in a non-volatile manner the result of the AND logical function and an OR logical function placed on the pair of complementary sense lines by the equilibrate circuitry.

38. The apparatus of claim 25, further comprising a pair of inverting transistors configured to transpose a first portion of the pair of complementary sense lines coupled to the sensing circuitry with respect to a second portion of the pair of complementary sense lines coupled to the array of memory cells.

39. The apparatus of claim 25, further comprising inverting circuitry configured to selectively couple a first portion of one of the pair of complementary sense lines to a ground reference and not couple a first portion of another one of the pair of complementary sense lines to the ground reference.

40. The apparatus of claim 39, wherein the inverting circuitry includes:
a first source/drain region of a first invert transistor coupled to a first source/drain region of a first pulldown transistor;
a first source/drain region of a second invert transistor coupled to a first source/drain region of a second pulldown transistor;
a first source/drain region of a first load transistor coupled to a second source/drain region of the first invert transistor and a first one of the pair of complementary sense lines;
a second source/drain region of the first load transistor coupled to a gate of the first pulldown transistor;
a first source/drain region of a second load transistor coupled to a second source/drain region of the second invert transistor and a second one of the pair of complementary sense lines;
a second source/drain region of the second load transistor coupled to a gate of the second pulldown transistor;
a gate of the first load transistor coupled to a gate of the second load transistor and a LOAD control signal line;
a second source/drain region of the first pulldown transistor and a second source/drain region of the second pulldown transistor coupled to a ground reference; and
a gate of the first invert transistor and a gate of the second invert transistor coupled to an INVERT control signal line.

41. The apparatus of claim 40, wherein:
the gate of the fifth transistor is selectively coupled to the first one of the pair of complementary sense lines through the first load transistor; and
the gate of the seventh transistor is selectively coupled to the second one of the pair of complementary sense lines through the second load transistor.

42. The apparatus of claim 39, further comprising a cross-coupled latch coupled between the second source/drain region of the first load transistor and the second source/drain region of the second load transistor.

43. The apparatus of claim 39, further comprising shift circuitry configured to selectively couple the inverting circuitry to a left-adjacent pair of complementary sense lines and a right-adjacent pair of complementary sense lines.

44. The apparatus of claim 43, wherein:
a gate of the first pulldown transistor is selectively coupled to an opposite sense line of each of the left and right-adjacent pair of complementary sense lines from a first sense line of the pair of complementary sense lines to which the first source/drain region of a first pulldown transistor is coupled through the first invert transistor; and
a gate of the second pulldown transistor is selectively coupled to an opposite sense line of each of the left and right-adjacent pair of complementary sense lines from a second sense line of the pair of complementary sense lines to which the first source/drain region of a second pulldown transistor is coupled through the second invert transistor.

45. A method, comprising:

modifying a precharge voltage of a sense line coupling an array of memory cells and sensing circuitry with a charge stored in a first memory cell of the array of memory cells to a modified voltage;

selectively not equilibrating the sense line to the precharge voltage from the modified voltage prior to modifying the modified voltage with a charge stored in a second memory cell based on a type of a logical function being performed and the modified voltage.

46. The method of claim 45, further comprising:

not precharging the sense line prior to coupling the second memory cell to the sense line when the modified voltage corresponds to a "0" logical data value during an AND logical function; and not precharging the sense line prior to coupling the second memory cell to the sense line when the modified voltage corresponds to a "1" logical data value during an OR logical function.

47. The method of claim 45, further comprising:

precharging the sense line prior to coupling the second memory cell to the sense line when the modified voltage corresponds to a "1" logical data value during an AND logical function; and precharging the sense line prior to coupling the second memory cell to the sense line when the modified voltage corresponds to a "0" logical data value is during an OR logical function.

* * * * *